(12) United States Patent  
Onuki

(10) Patent No.: US 9,373,368 B2
(45) Date of Patent: Jun. 21, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/725,109

(22) Filed: May 29, 2015

(65) Prior Publication Data

US 2015/0348601 A1 Dec. 3, 2015

(30) Foreign Application Priority Data

May 30, 2014 (JP) .................................. 2014-111826

(51) Int. Cl.
*G11C 11/24* (2006.01)
*G11C 7/00* (2006.01)
*G11C 5/06* (2006.01)
*G11C 5/14* (2006.01)

(52) U.S. Cl.
CPC .. *G11C 7/00* (2013.01); *G11C 5/06* (2013.01); *G11C 5/147* (2013.01)

(58) Field of Classification Search
USPC ............................. 365/149, 189.14, 189.011
See application file for complete search history.

(56) References Cited

U.S. PATENT DOCUMENTS

| 4,466,081 A | 8/1984 | Masuoka |
| 5,357,468 A | 10/1994 | Satani et al. |
| 5,615,145 A | 3/1997 | Takeuchi et al. |
| 5,627,782 A | 5/1997 | Tanaka et al. |
| 5,694,354 A | 12/1997 | Anami et al. |
| 5,706,241 A | 1/1998 | Nakamura et al. |

(Continued)

FOREIGN PATENT DOCUMENTS

| EP | 0053878 A | 6/1982 |
| EP | 1737044 A | 12/2006 |

(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Vu Le
(74) *Attorney, Agent, or Firm* — Fish & Richardson P.C.

(57) ABSTRACT

Provided is a semiconductor device including first to fifth circuits. The first circuit includes first and second transistors. The second circuit is capable of supplying one of first and second wirings with a gradually changing potential. The third circuit is capable of supplying a predetermined potential to the other of the first and second wirings and is capable of reading data stored in the first circuit. The fourth circuit is capable of comparing first data to be written to the first circuit with second data read by the third circuit. When a comparison result obtained by the fourth circuit concludes that the first data is consistent with the second data, the fifth circuit disconnects the second circuit from the first circuit, and a potential of the one of the first and second wirings is supplied to a gate of the second transistor.

16 Claims, 16 Drawing Sheets

(56) References Cited

U.S. PATENT DOCUMENTS

| | | |
|---|---|---|
| 5,719,811 A | 2/1998 | Kondou |
| 5,731,856 A | 3/1998 | Kim et al. |
| 5,742,551 A | 4/1998 | Yukutake et al. |
| 5,744,864 A | 4/1998 | Cillessen et al. |
| 5,818,791 A | 10/1998 | Tanaka et al. |
| 6,026,034 A | 2/2000 | Suzuki et al. |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,804,142 B2 | 10/2004 | Forbes |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0002800 A1 | 6/2001 | Imamiya |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0102910 A1 | 5/2006 | Yamazaki et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0221666 A1 | 10/2006 | Kang et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0008766 A1 | 1/2007 | Yoshioka |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0076510 A1 | 4/2007 | Mangan et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0027362 A1 | 2/2010 | Kang et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0058403 A1 | 3/2011 | Hashimoto et al. |
| 2011/0101351 A1 | 5/2011 | Yamazaki |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0286256 A1 | 11/2011 | Kamata |
| 2011/0317500 A1 | 12/2011 | Uochi et al. |
| 2012/0063204 A1 | 3/2012 | Kamata |
| 2012/0063244 A1 | 3/2012 | Kwon et al. |
| 2012/0069634 A1* | 3/2012 | Saito .................. G11C 11/404 365/149 |
| 2012/0153276 A1 | 6/2012 | Kamata |

FOREIGN PATENT DOCUMENTS

| | | |
|---|---|---|
| EP | 2226847 A | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-214492 A | 8/1998 |
| JP | 11-025682 A | 1/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086090 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

(56) References Cited

OTHER PUBLICATIONS

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAN's", IEEE Transactions on Electron Devices, Jun. 1, 1994, vol. 41, No. 6, pp. 926-931.

Dally.W et al., "4.1 MOS Transistor", Digital Systems Engineering, Mar. 30, 2003, p. 185, Maruzen.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFe2O4, and YB2Fe3O7 Types of Structures for Compounds in the IN2O3 and SC2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO ($Ga_2O_3$—$In_2O_3$-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

\* cited by examiner

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

Memory devices using semiconductor elements are roughly classified into a volatile memory device that loses stored data when power supply stops and a non-volatile memory device that retains stored data even when power supply stops.

A typical example of a volatile memory device is a dynamic random access memory (DRAM). A DRAM stores data in such a manner that a transistor included in a memory element is selected and charge is accumulated in a capacitor.

Once data is read from a DRAM, charge in a capacitor is lost according to the principle; thus, another writing operation is necessary every time data is read. A transistor included in a memory element has leakage current (off-state current) or the like between a source and a drain in an off state and charge flows into or out even when the transistor is not selected, so that a data retention period is short. For that reason, another writing operation (refresh operation) is necessary at predetermined intervals; thus, it is difficult to sufficiently reduce power consumption. Furthermore, since stored data is lost when power supply stops, an additional memory device using a magnetic material or an optical material is needed in order to store the data for a long time.

Another example of a volatile memory device is a static random access memory (SRAM). An SRAM retains stored data using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of a nonvolatile memory device is a flash memory. A flash memory includes a floating gate between a gate electrode and a channel formation region of a transistor and stores data by holding charge in the floating gate. Thus, a flash memory has advantages in that a data retention period is extremely long (semi-permanent) and refresh operation which is necessary in a volatile memory device is not needed (for example, see Patent Document 1).

However, a gate insulating layer included in a memory element deteriorates by tunneling current generated in writing, which causes a problem in that the memory element stops its function after a predetermined number of times of writing. In order to reduce adverse effects of this problem, a method in which the number of writing operations for memory elements is equalized is employed, for example. However, a complicated peripheral circuit is needed to achieve this method. Moreover, employing such a method does not solve the fundamental problem of lifetime. This means that a flash memory is not suitable for applications in which data is frequently rewritten.

In addition, high voltage is necessary for injection of electric charge to the floating gate or removal of the electric charge, and a circuit for generating high voltage is also necessary. Thus, there is a problem of high power consumption. Furthermore, it takes a relatively long time to inject or remove charge, and it is not easy to increase the speed of writing or erasing data.

In the flash memory, in order to increase storage capacity, a "multilevel" flash memory that stores data with greater than two levels in one memory cell is proposed (for example, see Patent Document 2).

In addition, in a multilevel memory, a "writing verify operation" of detecting a writing state of a memory cell after data is written is conducted in order to precisely control the state of the data writing to the memory cell (for example, see Patent Document 3).

REFERENCE

Patent Documents

[Patent Document 1] Japanese Published Patent Application No. S57-105889
[Patent Document 2] Japanese Published Patent Application No. H11-25682
[Patent Document 3] Japanese Published Patent Application No. H10-214492

SUMMARY OF THE INVENTION

An object of one embodiment of the present invention is to provide a novel semiconductor device. Another object of one embodiment of the present invention is to provide a highly reliable semiconductor device. Another object of one embodiment of the present invention is to provide a semiconductor device capable of reducing power consumption. Another object of one embodiment of the present invention is to provide a semiconductor device with a small area. Another object of one embodiment of the present invention is to provide a semiconductor device capable of operating at a high speed.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a first circuit, a second circuit, a third circuit, a fourth circuit, and a fifth circuit. The first circuit includes a first transistor and a second transistor. The first transistor contains an oxide semiconductor in a channel formation region. One of a source and a drain of the first transistor is electrically connected to a first wiring, and the other of the source and the drain of the first transistor is electrically connected to a gate of the second transistor. One of a source and a drain of the second transistor is electrically connected to the first wiring, and the other of the source and the drain of the second transistor is electrically connected to a second wiring. The second circuit is connected to the first circuit through the fifth circuit and one of the first wiring and the second wiring. The third circuit is connected to the first circuit through the other of the first wiring and the second wiring. The second circuit has a function of supplying the one of the first wiring and the second wiring with a gradually changing potential. The third circuit has a function of supplying a predetermined potential to the other of the first wiring and the second wiring and a function of reading data stored in the first circuit obtained from a potential of the other of the first wiring and the second wiring. The fourth circuit has a function of comparing first data that is to be written to the first circuit with second data read by the third circuit. The fifth circuit has a function of controlling conduction between the second circuit and the first circuit. When a comparison result obtained by the fourth circuit concludes that the first data is consistent with the second data, the fifth circuit disconnects the second circuit from the first circuit, and a potential of the one of the first wiring and the second wiring at the time when the fifth circuit disconnects the second circuit from the first circuit is supplied to the gate of the second transistor.

In the semiconductor device of one embodiment of the present invention, the gradually changing potential may be a potential that decreases from a high power supply potential to a low power supply potential.

In the semiconductor device of one embodiment of the present invention, the gradually changing potential may be a potential that increases from a low power supply potential to a high power supply potential.

In the semiconductor device of one embodiment of the present invention, the gradually changing potential may be supplied to the one of the first wiring and the second wiring after the predetermined potential is supplied to the other of the first wiring and the second wiring.

In the semiconductor device of one embodiment of the present invention, the fifth circuit may include a third transistor containing an oxide semiconductor in a channel formation region.

An electronic device of one embodiment of the present invention may include the semiconductor device and a display device, a speaker, or a microphone.

One embodiment of the present invention can provide a novel semiconductor device. One embodiment of the present invention can provide a highly reliable semiconductor device. One embodiment of the present invention can provide a semiconductor device capable of reducing power consumption. One embodiment of the present invention can provide a semiconductor device with a small area. One embodiment of the present invention can provide a semiconductor device capable of operating at a high speed.

Note that the description of these effects does not preclude the existence of other effects. In one embodiment of the present invention, there is no need to achieve all the effects. Other effects will be apparent from and can be derived from the description of the specification, the drawings, the claims, and the like.

DETAILED DESCRIPTION OF THE INVENTION

Figure 1:
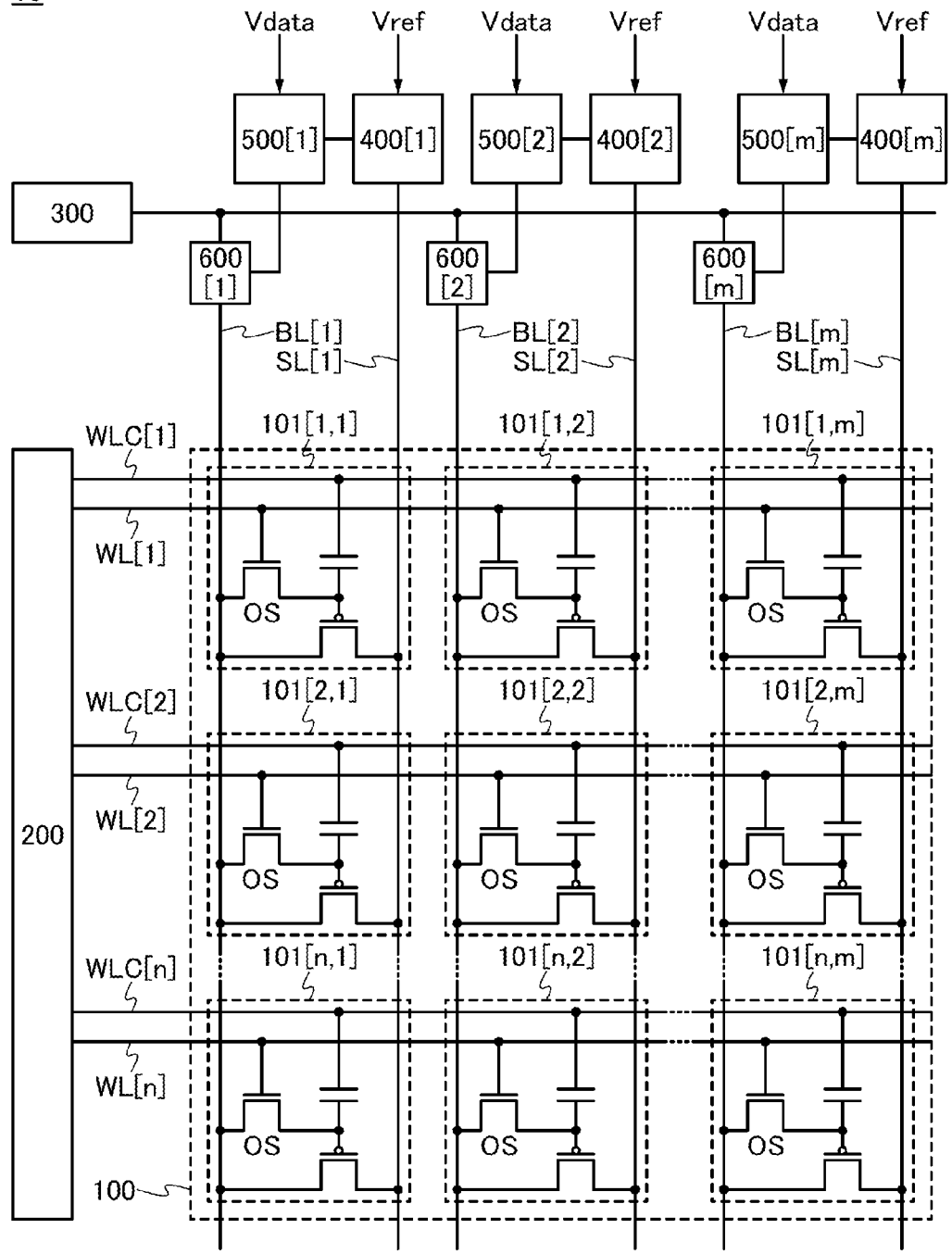
FIG. 1 illustrates a configuration example of a semiconductor device.

Hereinafter, embodiments of the present invention will be described below in detail with reference to the accompanying drawings. Note that the present invention is not limited to the following description and it is easily understood by those skilled in the art that the mode and details can be variously changed without departing from the scope and spirit of the present invention. Thus, the present invention should not be construed as being limited to the description in the following embodiments.

One embodiment of the present invention includes, in its category, devices including an integrated circuit, such as a radio frequency (RF) tag and a display device. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, common reference numerals are used for the same portions in different drawings in some cases.

Note that in this specification and the like, part of a diagram or a text described in one embodiment can be taken out to constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Thus, for example, in a diagram or a text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, whereby one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that, in this specification and the like, a content described in at least a diagram (which may be part of the diagram) is disclosed as one embodiment of the invention and can constitute one embodiment of the invention. Thus, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

When the range of a value that is defined by the maximum and minimum values is described, the range may be appropriately narrowed or part of the range may be excluded, whereby one embodiment of the invention excluding part of the range can be constructed. In this manner, it is possible to specify the technical scope of one embodiment of the present invention so that a conventional technology is excluded, for example.

Note that in this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element (e.g., a transistor), a passive element (e.g., a capacitor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Thus, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

(Embodiment 1)

In this embodiment, a configuration example of one embodiment of the present invention will be described.

FIG. 1 illustrates a configuration example of a semiconductor device 10 of one embodiment of the present invention. The semiconductor device 10 includes a circuit 100 having a plurality of circuits 101 (circuits 101[1, 1] to 101[$n, m$], where n and m are natural numbers), a circuit 200, a circuit 300, a plurality of circuits 400 (circuits 400[1] to 400[$m$]), a plurality of circuits 500 (circuits 500[1] to 500[$m$]), and a plurality of circuits 600 (circuits 600[1] to 600[$m$]).

In one embodiment of the present invention, data writing to the circuit 101 and data reading from the circuit 101 are performed at the same time. The circuit 500 compares data to be written to the circuit 101 with data read from the circuit 101 by the circuit 400. Thus, data is written while writing data and reading data are checked whether they are consistent with each other. Such an operation enables data to be accurately written and thus can provide a highly reliable semiconductor device. In addition, a verify operation can be performed at a high speed, providing a semiconductor device capable of high-speed operation. Each of the circuits illustrated in FIG. 1 will be described below.

The circuit 100 includes the circuits 101 each having a function of storing data. Here, the circuit 100 includes n×m circuits 101 (circuits 101[1, 1] to 101[$n, m$]). Each of the circuits 101 serves as a memory cell, and the circuit 100 serves as a memory cell array in which a plurality of memory cells are arranged in a matrix.

Each of the circuits 101 preferably includes a transistor containing an oxide semiconductor in a channel formation region (hereinafter, such a transistor is also referred to as an OS transistor). In the drawings, a transistor indicated by "OS" is an OS transistor. An oxide semiconductor has a wider band gap and lower intrinsic carrier density than silicon and the like. Thus, the off-state current of the OS transistor is extremely low. For this reason, the circuit 101 including the OS transistor can retain data for a long time.

Furthermore, the OS transistor can operate at a high speed when miniaturized. For this reason, the circuit 101 including the OS transistor can increase its writing speed and reading speed. Specifically, the writing speed and reading speed of the circuit 101 each can be shorter than or equal to 10 ns, preferably shorter than or equal to 5 ns, and further preferably shorter than or equal to 1 ns. Note that the channel length of the OS transistor can be less than or equal to 100 nm, preferably less than or equal to 60 nm, further preferably less than or equal to 40 nm, and still further preferably less than or equal to 30 nm.

The circuit 200 is a driver circuit having a function of selecting circuits 101 in a specific row from the plurality of the circuits 101. The circuit 200 is connected to the circuits 101 through a plurality of wirings WL (wirings WL[1] to WL[$n$]) and through a plurality of wirings WLC (wirings WLC[1] to WLC[$n$]). The circuit 200 has a function of supplying a potential for selecting circuits 101 in a specific row to the wiring WL and the wiring WLC.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. In the case where a signal output from X is transmitted to Y even when another circuit is interposed between X and Y, for example, X and Y are functionally connected. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of the wiring and the electrode. Thus, "electrical connection" in this specification includes in its category such a case where one conductive film has functions of a plurality of components.

The circuit 300 has a function of outputting a gradually changing (decreasing or increasing) potential. Specifically, the circuit 300 can output a potential that gradually decreases from a high power supply potential Vdd to a low power supply potential Vss or a potential that gradually increases from the low power supply potential Vss to the high power supply potential Vdd. Note that the low power supply potential Vss may be a ground potential Vgnd.

The circuit 300 is connected to wirings BL through the circuits 600. This means that the circuit 300 has a function of supplying the wirings BL with a potential corresponding to data to be written to the circuits 101 (hereinafter, such a potential is also referred to as a writing potential). Specifically, the circuit 300 can supply, as the writing potential, a potential that gradually decreases from the high power supply potential Vdd to the low power supply potential Vss or a potential that gradually increases from the low power supply potential Vss to the high power supply potential Vdd to the wirings BL. When the potential of a wiring BL reaches a predetermined level, the corresponding circuit 600 disconnects the circuit 300 from the corresponding circuit 101 and the potential of the wiring BL is kept constant, as described later.

The circuits 400 each have a function of reading data which is stored in a circuit 101 and obtained from a potential of a wiring SL (hereinafter, such a potential is also referred to as a reading potential), which corresponds to data stored in the circuit 101. Specifically, the circuits 400 each have a function of comparing the reading potential with a reference potential Vref and outputting the comparison result to the circuit 500. Here, the reference potential Vref can be any potential between the high power supply potential Vdd and the low power supply potential Vss. The reference potential Vref can be, for example, approximately half of the high power supply potential Vdd. Whether data stored in the circuit 101 is at a high level or a low level can be determined from the magnitude relation between the reading potential and the reference potential Vref.

In the case where the circuit 101 stores multilevel data with three or more levels, a configuration is preferred with which two or more reference potentials Vref are input to the circuit 400. In the case where the circuit 101 stores four-level data, for example, three reference potentials Vref1, Vref2, and Vref3 are input to the circuit 400. Owing to comparison of the levels of the reading potential and the three reference potentials, four-level data can be read.

Furthermore, the circuits 400 each have a function of supplying a predetermined potential to the wiring SL. Specifically, the circuits 400 each have a function of precharging the wiring SL to the high power supply potential Vdd or the low power supply potential Vss. This precharging of the wiring SL, which will be described in detail later, is performed when data stored in the circuit 101 is read.

The circuits 500 each have a function of comparing a potential Vdata input from the outside with a potential input from the circuit 400. Note that the potential Vdata corresponds to data to be written to the circuit 101. The circuits 500 each can determine whether data read from the circuit 101 by the circuit 400 is consistent with data to be written to the circuit 101 or not, thereby determining whether data writing is performed accurately or not. It can be determined that data is written accurately when the potential Vdata is consistent with the potential input from the circuit 400 and that data writing is insufficient or wrong data is written when the potential Vdata and the potential input from the circuit 400 are not consistent with each other. In the above manner, data writing and data reading are performed at the same time to check whether writing data and reading data are consistent with each other; thus, data can be accurately written.

The circuits 600 each have a function of controlling conduction between the circuit 300 and the wiring BL depending on the comparison result obtained by the circuit 500. Specifically, when writing data and reading data are not consistent with each other, the corresponding circuit 600 remains on and a gradually changing potential, which is output from the circuit 300, is supplied to the circuit 101 through the wiring BL. Meanwhile, when writing data and reading data are consistent with each other, the corresponding circuit 600 disconnects the circuit 300 from the circuit 101 and the potential of the wiring BL is fixed to a constant value. The fixed potential is retained as the writing potential in the circuit 101. With the use of the potential of the wiring BL at the time of accurate data writing as the writing potential in such a manner, data can be accurately written to the circuit 101.

Each of the circuits 600 can be a transistor, for example. In that case, a gate of the transistor can be connected to the circuit 500, one of a source and a drain thereof can be connected to the circuit 300, and the other of the source and the drain thereof can be connected to the wiring BL. Note that when an OS transistor is used as the transistor, current that flows between the circuit 300 and the wiring BL while the transistor is off can be extremely low. Thus, a change in potential output from the circuit 300 can be prevented from being transmitted to the wiring BL, leading to prevention of the potential change of the wiring BL.

Note that a "source" of a transistor in this specification means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

As described above, in one embodiment of the present invention, data writing and data reading are performed at the same time to check whether writing data and reading data are consistent with each other; thus, data can be accurately written. Accordingly, the reliability of the semiconductor device 10 can be improved.

Note that although FIG. 1 illustrates the configuration in which the wirings BL are connected to the circuit 300 through the circuits 600 and the wirings SL are connected to the circuits 400, one embodiment of the present invention is not limited thereto. For example, the wirings SL may be connected to the circuit 300 through the circuits 600 and the wirings BL may be connected to the circuits 400, in which case the writing potential is supplied to the wirings SL and the reading potential is supplied to the wirings BL. A semiconductor device with such a configuration can perform operation similar to that of the semiconductor device 10 illustrated in FIG. 1.

Furthermore, although FIG. 1 illustrates the configuration in which the circuit 300 is connected to wirings BL[1] to BL[m] through the circuits 600[1] to 600[m], the circuit 300 may be provided for each column of the circuits 101. In other words, the semiconductor device 10 may include circuits 300[1] to 300[m] and have a configuration in which the circuit 300[1] is connected to the wiring BL[1] through the circuit 600[1], the circuit 300[2] is connected to the wiring BL[2] through the circuit 600[2], and the circuit 300[m] is connected to the wiring BL[m] through the circuit 600[m].

Next, specific configuration examples of the semiconductor devices 10 of one embodiment of the present invention and operations of the semiconductor devices will be described with reference to FIGS. 2A and 2B, FIGS. 3A and 3B, FIGS. 4A and 4B, and FIGS. 5A and 5B.

Figures 2A, 2B:
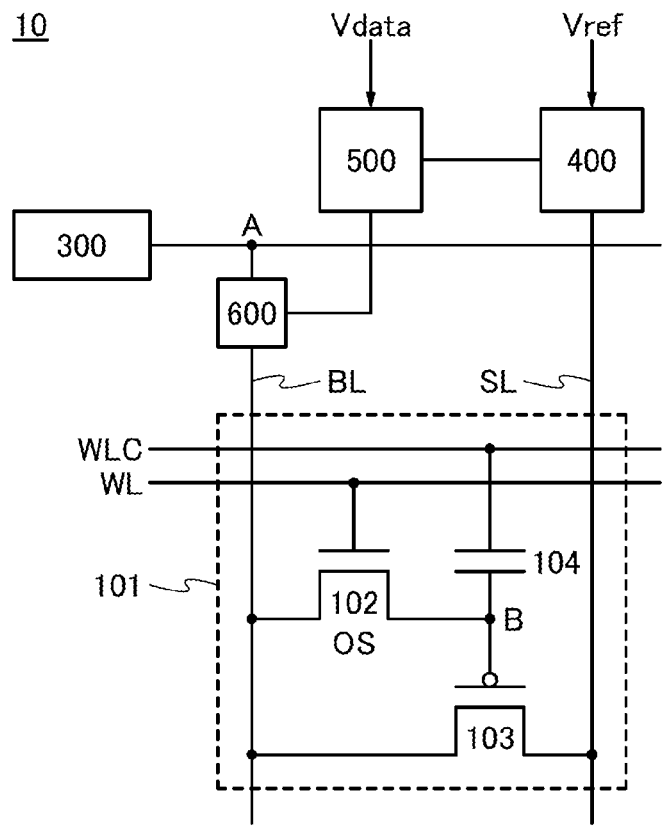
FIGS. 2A and 2B illustrate a configuration example of a semiconductor device and an operation of the semiconductor device.

FIG. 2A illustrates an example of a connection relation of the circuit 101, the circuit 300, the circuit 400, the circuit 500, and the circuit 600 and a specific configuration example of the circuit 101.

The circuit 101 includes a transistor 102, a transistor 103, and a capacitor 104. A gate of the transistor 102 is connected to the wiring WL, one of a source and a drain thereof is connected to the wiring BL, and the other of the source and the drain thereof is connected to a gate of the transistor 103 and one electrode of the capacitor 104. One of a source and a drain of the transistor 103 is connected to the wiring BL, and the other of the source and the drain is connected to the wiring SL. The other electrode of the capacitor 104 is connected to the wiring WLC. Here, a node between the circuit 300 and the circuit 600 is a node A, and a node at which the other of the source and the drain of the transistor 102, the gate of the transistor 103, and one electrode of the capacitor 104 are connected is a node B. When the transistor 102 is turned off, charge corresponding to data to be stored in the circuit 101 is retained in the node B.

An OS transistor is preferably used as the transistor 102. Since the off-state current of the OS transistor is extremely low, the potential of the node B can be retained for a long time when the transistor 102 is off. For this reason, data stored in the circuit 101 can be retained even in a period during which power supply to the circuit 101 is stopped. Thus, the circuit 101 can be used as a nonvolatile memory cell or a memory cell with an extremely low refresh frequency, leading to a reduction in power consumption of the semiconductor device 10.

As the transistor 103, a transistor containing a single crystal semiconductor in a channel formation region can be used. The transistor can be formed using a substrate of a single crystal semiconductor, such as a single crystal silicon substrate or a single crystal germanium substrate. Since the transistor containing a single crystal semiconductor in the channel formation region has a high current supply capability, the operation speed of the circuit 101 including such a transistor as the transistor 103 can be increased.

Alternatively, as the transistor 103, a transistor whose channel formation region is formed in a semiconductor film can be used. Specifically, a transistor containing a non-single-crystal semiconductor in a channel formation region can be used as the transistor 103. As the non-single-crystal semiconductor, non-single-crystal silicon such as amorphous silicon, microcrystalline silicon, or polycrystalline silicon; non-single-crystal germanium such as amorphous germanium, microcrystalline germanium, or polycrystalline germanium; or the like can be used. Further alternatively, an OS transistor can be used as the transistor 103, in which case the transistors 102 and 103 can be formed in the same process.

Note that in the circuit 101, the transistors 102 and 103 can be stacked. For example, an insulating layer may be provided over the transistor 103 and the transistor 102 may be provided over the insulating layer. With such a structure, the area of the circuit 101 can be small. The stacked structure of the transistors 102 and 103 will be described in detail in Embodiments 3 to 5.

The wiring BL is connected to the circuit 300 through the circuit 600. The wiring SL is connected to the circuit 400. The writing potential and the reading potential are supplied to the wiring BL and the wiring SL, respectively.

Then, an example of a write operation and a read operation of the circuit 101 illustrated in FIG. 2A will be described using a timing chart in FIG. 2B. Here, the case where low-level data is written to the circuit 101 (the case where the potential Vdata is at a low level) will be described. In the following description, the high power supply potential Vdd can be used as a high-level potential and the low power supply potential Vss can be used as a low-level potential.

First, in Period T1, the potentials of the wirings SL and BL are set at a high level. Then, the wiring SL is brought into a floating state.

Next, in Period T2, the potential of the wiring WL is set at a high level so that the transistor 102 is turned on. As a result, the wiring BL is electrically connected to the node B. In addition, the potential of the wiring WLC is set at a low level.

Then, after the circuit 600 is turned on, a potential that gradually decreases from a high level to a low level is supplied from the circuit 300 to the wiring BL and the node B through the node A and the circuit 600. The potential of the wiring SL remains at a high level immediately after the potentials of the wiring BL and the node B start to decrease. However, when the potentials of the wiring BL and the node B further decrease and the voltage between the gate and the source of the transistor 103 becomes lower than or equal to the threshold voltage, the transistor 103 is turned on and the potential of the wiring SL starts to decrease. Here, the voltage between the wiring BL and the wiring SL is substantially equal to the threshold voltage of the transistor 103.

Next, in Period T3, when the potential of the wiring SL decreases to the reference potential Vref, low-level data is read by the circuit 400. After the circuit 500 confirms that the potential Vdata and a potential input from the circuit 400 are both at a low level and writing data and reading data are consistent with each other, a signal is output from the circuit 500 to the circuit 600 and the circuit 600 disconnects the circuit 300 from the circuit 101.

At this time, the potential of the node A keeps decreasing because a gradually decreasing potential is output from the circuit 300, whereas the potential of the wiring BL stops decreasing and is fixed to a constant value because the circuit 600 disconnects the circuit 300 from the circuit 101. The potential of the wiring BL at this time is supplied to the node B as the writing potential.

Subsequently, in Period T4, the output of the circuit 300 is reset to a high-level potential. Thus, the potential of the node A is set at a high level.

Then, in Period T5, the potential of the wiring WL is set at a low level so that the transistor 102 is turned off. As a result, the potential of the node B is retained and data is stored in the circuit 101.

After that, in Period T6, the potential of the wiring WLC is set at a high level so that the potential of the node B is increased to reach a high level. In addition, the potentials of the wirings BL and SL are set at a high level.

In the above manner, data writing and data reading are performed at the same time while a gradually decreasing potential is supplied to the wiring BL, and the potential of the wiring BL at the time when the writing data and the reading data are consistent with each other is stored in the node B as the writing potential. Accordingly, data can be written while the writing data and the reading data are checked whether they are consistent with each other, leading to accurate data writing.

Figure 3A:
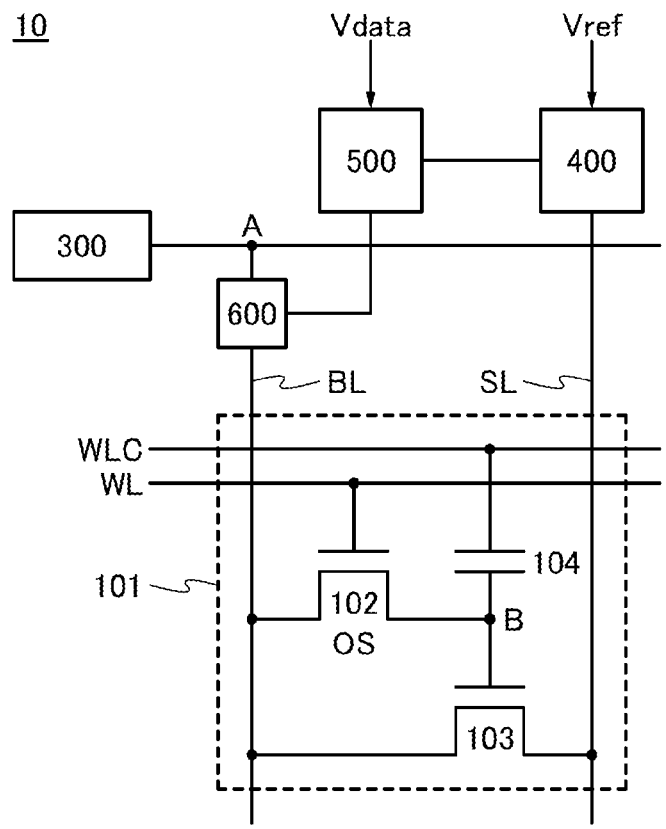
FIGS. 3A and 3B illustrate a configuration example of a semiconductor device and an operation of the semiconductor device.
Figure 3B:
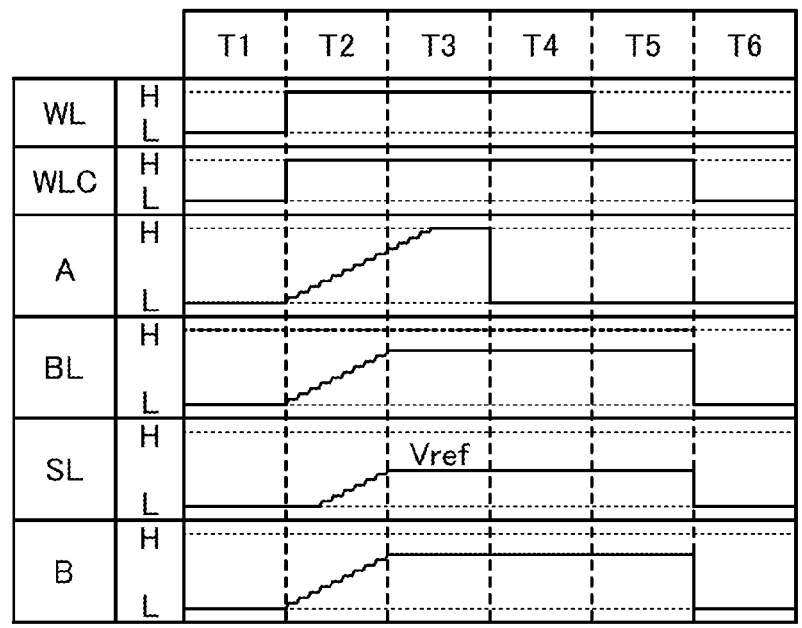

Note that although a p-channel transistor is used as the transistor 103 in FIG. 2A, an n-channel transistor can be used instead. FIG. 3A illustrates a configuration of the semiconductor device 10 in which the transistor 103 is an n-channel transistor.

When the transistor 103 is an n-channel transistor, data writing can be performed as in the case of using a p-channel transistor. An example of a write operation and a read operation of the circuit 101 illustrated in FIG. 3A will be described using a timing chart in FIG. 3B. Here, the case where high-level data is written to the circuit 101 (the case where the potential Vdata is at a high level) will be described.

First, in Period T1, the potentials of the wirings SL and BL are set at a low level. Then, the wiring SL is brought into a floating state.

Next, in Period T2, the potential of the wiring WL is set at a high level so that the transistor 102 is turned on. As a result, the wiring BL is electrically connected to the node B. In addition, the potential of the wiring WLC is set at a high level.

Then, after the circuit 600 is turned on, a potential that gradually increases from a low level to a high level is supplied from the circuit 300 to the wiring BL and the node B through the node A and the circuit 600. The potential of the wiring SL remains at a low level immediately after the potentials of the wiring BL and the node B start to increase. However, when the potentials of the wiring BL and the node B further increase and the voltage between the gate and the source of the transistor 103 becomes higher than or equal to the threshold voltage, the transistor 103 is turned on and the potential of the wiring SL starts to increase. Here, the voltage between the wiring BL and the wiring SL is substantially equal to the threshold voltage of the transistor 103.

Next, in Period T3, when the potential of the wiring SL increases to the reference potential Vref, high-level data is read by the circuit 400. After the circuit 500 confirms that the potential Vdata and a potential input from the circuit 400 are both at a high level and writing data and reading data are consistent with each other, a signal is output from the circuit 500 to the circuit 600 and the circuit 600 disconnects the circuit 300 from the circuit 101.

At this time, the potential of the node A keeps increasing because a gradually increasing potential is output from the circuit 300, whereas the potential of the wiring BL stops increasing and is fixed to a constant value because the circuit 600 disconnects the circuit 300 from the circuit 101. The potential of the wiring BL at this time is supplied to the node B as the writing potential.

Subsequently, in Period T4, the output of the circuit 300 is reset to a low-level potential. Thus, the potential of the node A is set at a low level.

Then, in Period T5, the potential of the wiring WL is set at a low level so that the transistor 102 is turned off. As a result, the potential of the node B is retained and data is stored in the circuit 101.

After that, in Period T6, the potential of the wiring WLC is set at a low level so that the potential of the node B is decreased to reach a low level. In addition, the potentials of the wirings BL and SL are set at a low level.

In the above manner, also when the transistor 103 is an n-channel transistor, data can be written while the writing data and the reading data are checked whether they are consistent with each other.

Figure 4A:
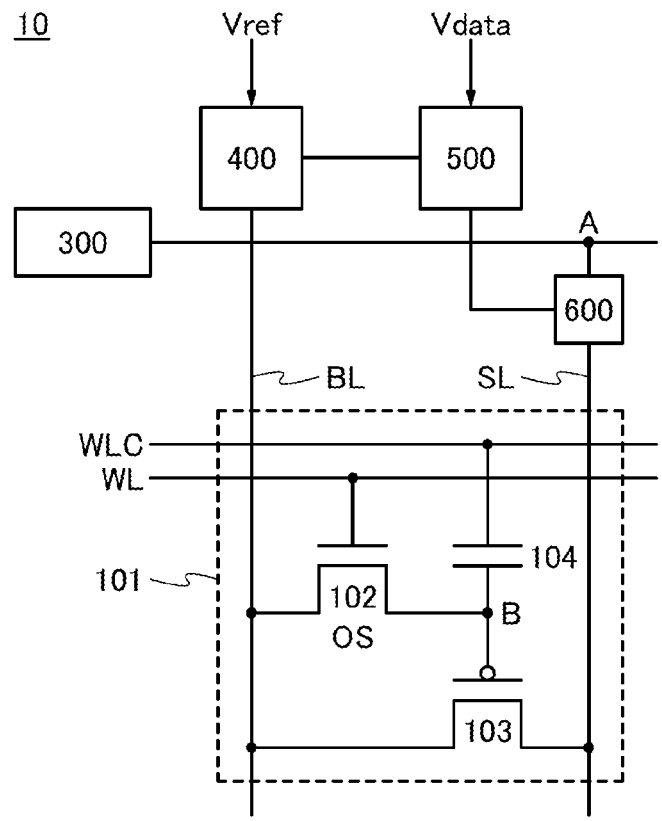
FIGS. 4A and 4B illustrate a configuration example of a semiconductor device and an operation of the semiconductor device.

FIG. 4A illustrates a different configuration example of the semiconductor device 10.

In FIG. 4A, a connection relation of the circuit 101, the circuit 300, the circuit 400, the circuit 500, and the circuit 600 is different from that in FIG. 2A. Specifically, the wiring BL is connected to the circuit 400 and the wiring SL is connected to the circuit 300 through the circuit 600. The reading potential and the writing potential are supplied to the wiring BL and the wiring SL, respectively. Note that the transistor 103 is a p-channel transistor.

Figure 4B:
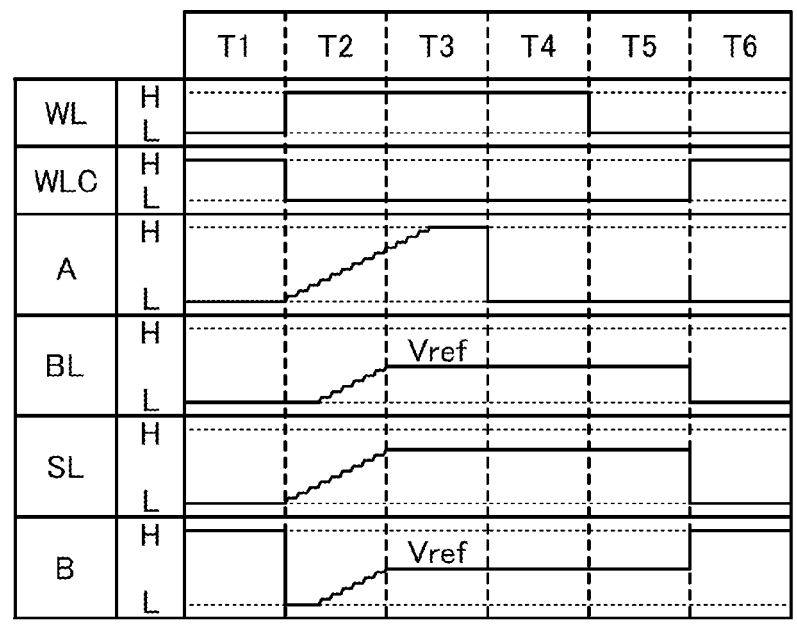

Here, an example of a write operation and a read operation of the circuit 101 illustrated in FIG. 4A will be described using a timing chart in FIG. 4B. Here, the case where high-level data is written to the circuit 101 (the case where the potential Vdata is at a high level) will be described.

First, in Period T1, the potentials of the wirings BL and SL are set at a low level. Then, the wiring BL is brought into a floating state.

Next, in Period T2, the potential of the wiring WL is set at a high level so that the transistor 102 is turned on. As a result, the wiring BL is electrically connected to the node B. In addition, the potential of the wiring WLC is set at a low level.

Then, after the circuit 600 is turned on, a potential that gradually increases from a low level to a high level is supplied from the circuit 300 to the wiring SL through the node A and the circuit 600. The potentials of the wiring BL and the node B remain at a low level immediately after the potential of the wiring SL starts to increase. However, when the potential of the wiring SL further increases and the voltage between the gate and the source of the transistor 103 becomes lower than or equal to the threshold voltage, the transistor 103 is turned on and the potentials of the wiring BL and the node B start to increase. Here, the voltage between the wiring BL and the wiring SL is substantially equal to the threshold voltage of the transistor 103.

Next, in Period T3, when the potential of the wiring BL increases to the reference potential Vref, high-level data is read by the circuit 400. After the circuit 500 confirms that the potential Vdata and a potential input from the circuit 400 are both at a high level and writing data and reading data are consistent with each other, a signal is output from the circuit 500 to the circuit 600 and the circuit 600 disconnects the circuit 300 from the circuit 101.

At this time, the potential of the node A keeps increasing because a gradually increasing potential is output from the circuit 300, whereas the potential of the wiring SL stops increasing and is fixed to a constant value because the circuit 600 disconnects the circuit 300 from the circuit 101. The potential of the wiring SL at this time is supplied to the node B as the writing potential through the transistor 103 and the transistor 102.

Subsequently, in Period T4, the output of the circuit 300 is reset to a low-level potential. Thus, the potential of the node A is set at a low level.

Then, in Period T5, the potential of the wiring WL is set at a low level so that the transistor 102 is turned off. As a result, the potential of the node B is retained and data is stored in the circuit 101.

After that, in Period T6, the potential of the wiring WLC is set at a high level so that the potential of the node B is increased to reach a high level. In addition, the potentials of the wirings BL and SL are set at a low level.

Figure 5A:
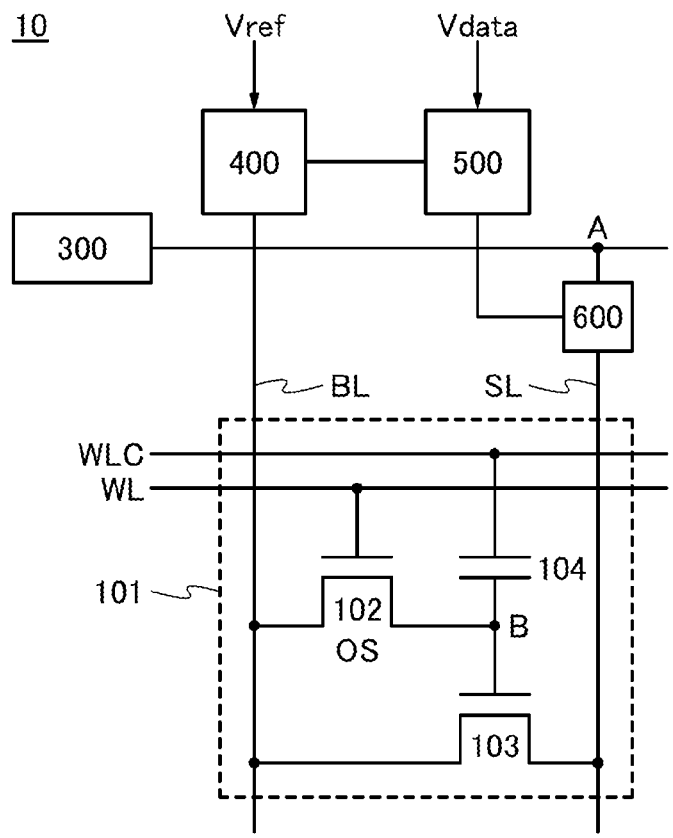
FIGS. 5A and 5B illustrate a configuration example of a semiconductor device and an operation of the semiconductor device.
Figure 5B:
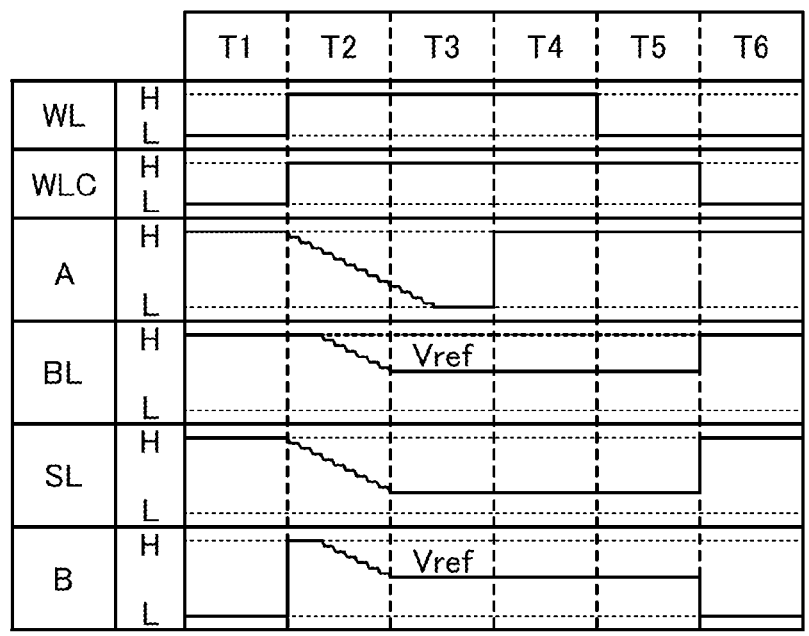

Note that although a p-channel transistor is used as the transistor 103 in FIG. 4A, an n-channel transistor can be used instead. FIG. 5A illustrates a configuration of the semiconductor device 10 in which the transistor 103 is an n-channel transistor.

When the transistor 103 is an n-channel transistor, data writing can be performed as in the case of using a p-channel transistor. An example of a write operation and a read operation of the circuit 101 illustrated in FIG. 5A will be described using a timing chart in FIG. 5B. Here, the case where low-level data is written to the circuit 101 (the case where the potential Vdata is at a low level) will be described.

First, in Period T1, the potentials of the wirings BL and SL are set at a high level. Then, the wiring BL is brought into a floating state.

Next, in Period T2, the potential of the wiring WL is set at a high level so that the transistor 102 is turned on. As a result, the wiring BL is electrically connected to the node B. In addition, the potential of the wiring WLC is set at a high level.

Then, after the circuit 600 is turned on, a potential that gradually decreases from a high level to a low level is supplied from the circuit 300 to the wiring SL through the node A and the circuit 600. The potentials of the wiring BL and the node B remain at a high level immediately after the potential of the wiring SL starts to decrease. However, when the potential of the wiring SL further decreases and the voltage between the gate and the source of the transistor 103 becomes higher than or equal to the threshold voltage, the transistor 103 is turned on and the potentials of the wiring BL and the node B start to decrease. Here, the voltage between the wiring BL and the wiring SL is substantially equal to the threshold voltage of the transistor 103.

Next, in Period T3, when the potential of the wiring BL decreases to the reference potential Vref, low-level data is read by the circuit 400. After the circuit 500 confirms that the potential Vdata and a potential input from the circuit 400 are both at a low level and writing data and reading data are consistent with each other, a signal is output from the circuit 500 to the circuit 600 and the circuit 600 disconnects the circuit 300 from the circuit 101.

At this time, the potential of the node A keeps decreasing because a gradually decreasing potential is output from the circuit 300, whereas the potential of the wiring SL stops decreasing and is fixed to a constant value because the circuit 600 disconnects the circuit 300 from the circuit 101. The potential of the wiring SL at this time is supplied to the node B as the writing potential through the transistor 103 and the transistor 102.

Subsequently, in Period T4, the output of the circuit 300 is reset to a high-level potential. Thus, the potential of the node A is set at a high level.

Then, in Period T5, the potential of the wiring WL is set at a low level so that the transistor 102 is turned off. As a result, the potential of the node B is retained and data is stored in the circuit 101.

After that, in Period T6, the potential of the wiring WLC is set at a low level so that the potential of the node B is decreased to reach a low level. In addition, the potentials of the wirings BL and SL are set at a high level.

As described above, the configurations illustrated in FIGS. 4A and 4B and FIGS. 5A and 5B, in which the reading potential is supplied to the wiring BL and the writing potential is supplied to the wiring SL unlike in the configurations in FIGS. 2A and 2B and FIGS. 3A and 3B, enable data to be written while the writing data and the reading data are checked whether they are consistent with each other.

In the above manner, in one embodiment of the present invention, data writing to the circuit 101 and data reading from the circuit 101 are performed at the same time. The circuit 500 compares data to be written to the circuit 101 with data read from the circuit 101 by the circuit 400. Thus, data is written while writing data and reading data are checked whether they are consistent with each other. Such an operation enables data to be accurately written and thus can provide a highly reliable semiconductor device. In addition, a verify operation can be performed at a high speed, providing a semiconductor device capable of high-speed operation.

Until the potentials of all of the wirings BL or all of the wirings SL are fixed to a constant value, the circuit 300 keeps supplying a gradually changing potential; however, the circuits 600[1] to 600[*m*] individually disconnect the circuit 300 from the corresponding circuit 101 when the corresponding writing data and reading data are consistent with each other. Accordingly, the potentials of the wirings BL or the wirings SL can be individually fixed. In this manner, the potentials of the wirings BL or the wirings SL can be individually fixed without providing the circuit 300 for each column.

This embodiment can be combined with any of the other embodiments as appropriate. Note that content (or may be part of the content) described in one embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed. This applies also to other embodiments.

(Embodiment 2)

In this embodiment, configuration examples of the circuits included in the semiconductor device 10 will be described.

Figure 6:
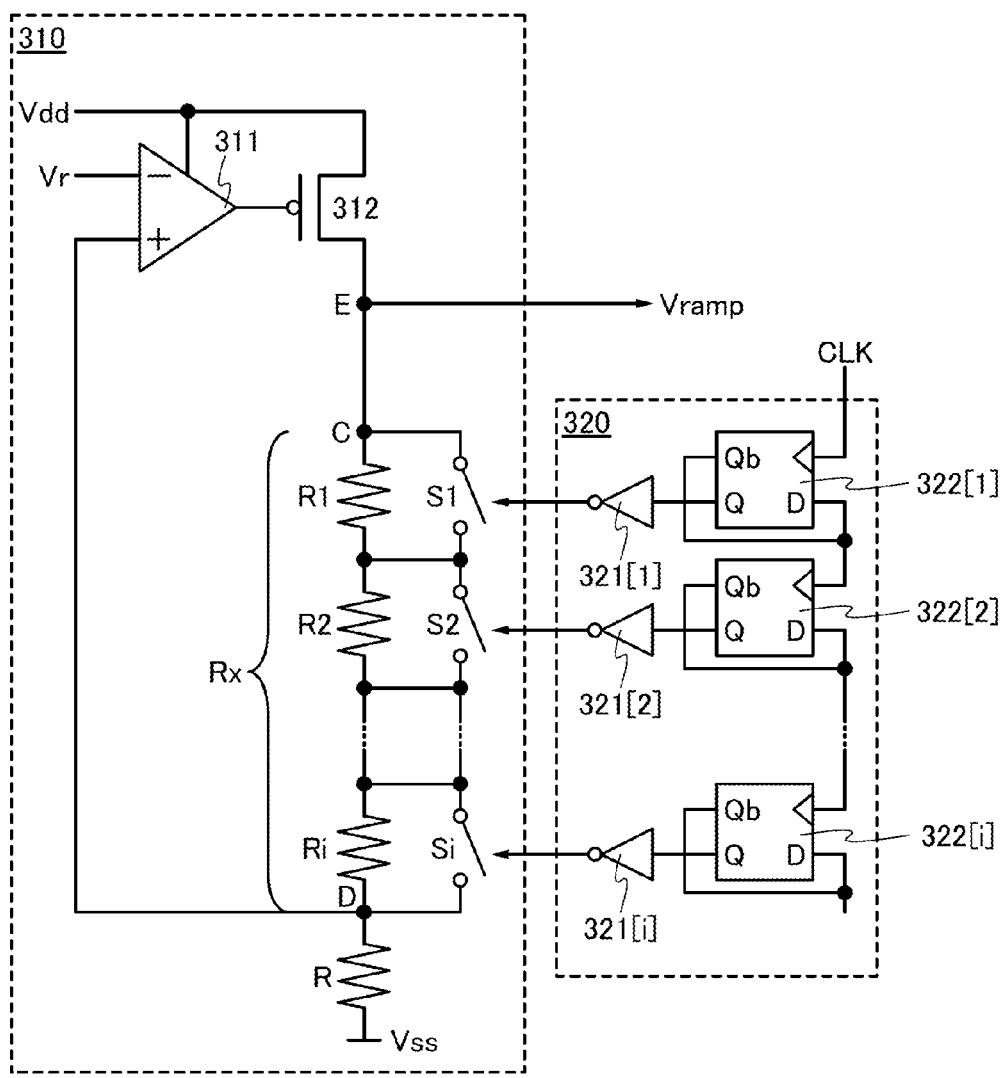
FIG. 6 is a circuit diagram illustrating a configuration example of a semiconductor device.

FIG. 6 illustrates a configuration example of the circuit 300. The circuit 300 is a potential control circuit having a function of outputting a gradually changing potential. The circuit 300 includes a circuit 310 and a circuit 320.

The circuit 310 includes a comparator 311, a transistor 312, resistors R1 to R$i$ ($i$ is a natural number) connected in series, switches S1 to S$i$, and a resistor R. The circuit 320 includes inverters 321[1] to 321[$i$] and flip-flops 322[1] to 322[$i$]. The detailed descriptions of connection relations of elements in the circuit 310 and the circuit 320 are omitted because they are apparent from FIG. 6. Note that even when the elements are directly connected to each other in FIG. 6, the actual elements may be electrically or functionally connected to each other (the same applies to the other drawings).

The circuit 310 has a function of outputting a gradually changing potential. Specifically, the circuit 320 controls conduction of the switches S1 to Si, and resistance Rx between a node C and a node D gradually changes. A potential Vramp of a node E can be expressed by Vramp=Vr(1+Rx/R), where Vr represents a potential input to a non-inverting input terminal of the comparator 311; thus, the potential Vramp gradually changes when the resistance Rx gradually changes. The gradually changing potential Vramp is supplied to the wiring SL or the wiring BL through the circuit 600 (see FIG. 1, FIGS. 2A and 2B, FIGS. 3A and 3B, FIGS. 4A and 4B, and FIGS. 5A and 5B).

The circuit 320 has a function of controlling conduction of the switches S1 to Si. Described here is a configuration example where the circuit 320 outputs a signal for controlling conduction of the switches S1 to Si such that the resistance Rx gradually decreases, with a clock signal CLK input as an input signal. As the resistance Rx gradually decreases, the potential Vramp gradually decreases. Such a potential Vramp can be used for operation of the circuits illustrated in FIG. 2A and FIG. 5A.

Note that a transistor or the like can be used as any of the switches S1 to Si, in which case one of a source and a drain of the transistor serves as a first terminal of the switch and the other of the source and the drain serves as a second terminal of the switch. In addition, a gate of the transistor can be connected to the inverter 321.

An OS transistor can be used as any of the switches S1 to Si. Since the off-state current of the transistor is extremely low, the resistance Rx in that case can be controlled accurately and an error of the gradually changing potential Vramp can be reduced.

As the transistor 312, a transistor containing a single crystal semiconductor in a channel formation region can be used, in which case the operation speed of the circuit 310 can be increased. Alternatively, an OS transistor can be used as the transistor 312, in which case the transistor 312 and the switches S1 to Si formed of OS transistors can be formed in the same process.

Note that FIG. 6 illustrates an example where the circuit 300 outputs the gradually decreasing potential Vramp; alternatively, the circuit 300 may output the gradually increasing potential Vramp. With the circuit 320 not including the inverters 321[1] to 321[i], for example, the potential Vramp can be a gradually increasing potential. Such a potential Vramp can be used for operation of the circuits illustrated in FIG. 3A and FIG. 4A.

Figure 7:
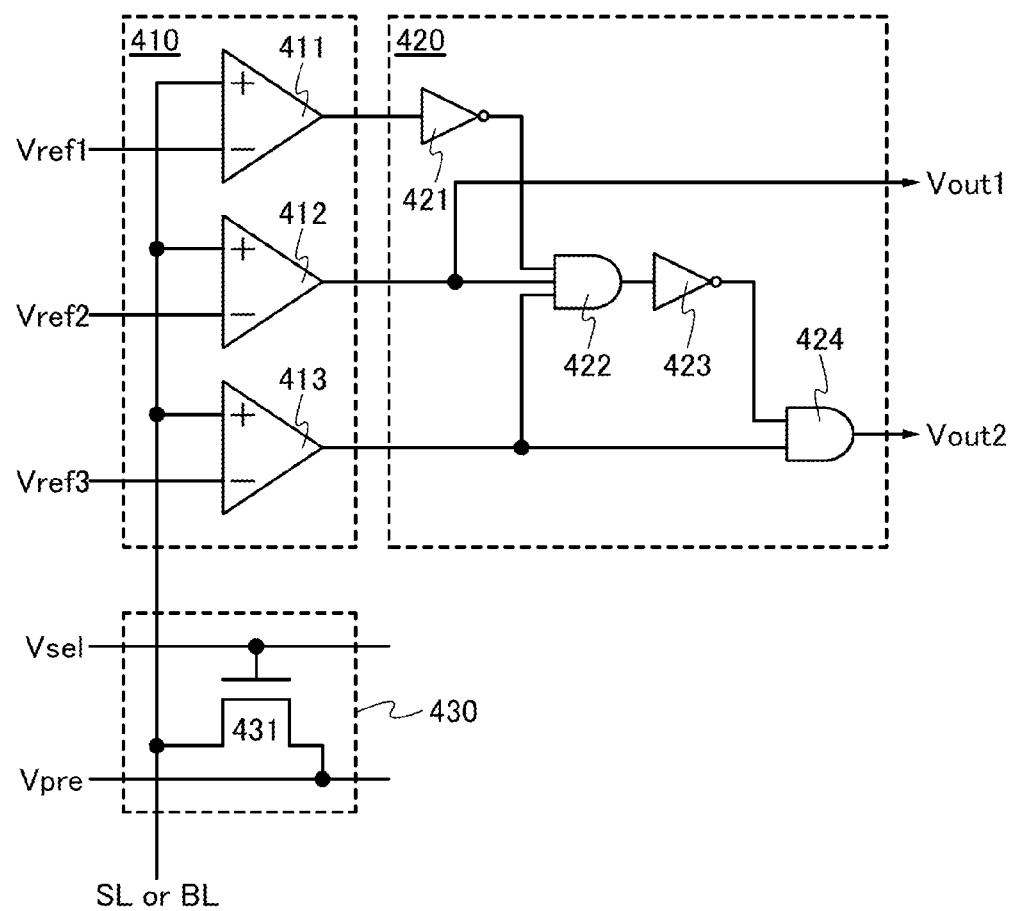
FIG. 7 is a circuit diagram illustrating a configuration example of a semiconductor device.

FIG. 7 illustrates a configuration example of the circuit 400. The circuit 400 is a read circuit having a function of reading data stored in the circuit 101 and a function of precharging the wiring SL or the wiring BL to a predetermined potential. The circuit 400 includes a circuit 410, a circuit 420, and a circuit 430.

The circuit 410 is a comparator circuit having a function of comparing the potential of the wiring SL or the wiring BL with a reference potential and outputting the comparison result to the circuit 420. Here, the circuit 410 having a function of reading four-level data stored in the circuit 101 is described as an example.

The circuit 410 includes comparators 411 to 413. The potential of the wiring SL or the wiring BL and one of the reference potentials Vref1 to Vref3 are input to each of the comparators 411 to 413. Then, the potential of the wiring SL or the wiring BL is compared with the reference potentials Vref1 to Vref3, and four-level data stored in the circuit 101 is read.

Although the configuration of the circuit 410 in the case of reading four-level data is described here, data to be read can be binary data or multilevel data with three or more levels. The number of kinds of reference potential Vref input to the circuit 410 and the number of comparators included in the circuit 410 depend on the number of levels of data to be read. In the case where binary data is read as in the case of FIGS. 2A and 2B, FIGS. 3A and 3B, FIGS. 4A and 4B, or FIGS. 5A and 5B, for example, the number of kinds of reference potential is one and the number of the comparators is one. In the case where four-level data is read, the number of kinds of reference potential is three and the number of the comparators is three. In other words, when j-bit (j is a natural number) data is read, $(2^j-1)$ kind(s) of reference potential is/are input to the circuit 410 and $2^j-1$) comparator(s) is/are provided.

The circuit 420 is a convertor circuit having a function of converting the comparison result obtained by the circuit 410 into data represented by "0" and "1". The circuit 420 is necessary for reading data with two or more bits, and thus can be omitted when 1-bit (binary) data is read as in the case of FIGS. 2A and 2B, FIGS. 3A and 3B, FIGS. 4A and 4B, or FIGS. 5A and 5B.

The circuit 420 includes an inverter 421, an AND gate 422, an inverter 423, and an AND gate 424. The detailed descriptions of connection relations of elements are omitted because they are apparent from FIG. 7. The circuit 420 converts the comparison result obtained by the circuit 410 into a potential Vout1 and a potential Vout2 and outputs these potentials to the circuit 500.

The circuit 430 is a precharge circuit having a function of precharging the wiring SL or the wiring BL to a predetermined potential. When a potential Vsel is set to a potential at which a transistor 431 is turned on, a precharge potential Vpre is supplied to the wiring SL or the wiring BL. With the circuit 400 including the circuit 430, the wiring SL or the wiring BL can be precharged to a high level or a low level in Period T1 in FIG. 2A, FIG. 3A, FIG. 4A, or FIG. 5A. In the case where an OS transistor is used as the transistor 431, leakage of the potential Vpre to the wiring SL or the wiring BL can be prevented while the transistor 431 is off, leading to prevention of potential change of the wiring SL or the wiring BL. The transistor 431 may be an n-channel transistor or a p-channel transistor.

Figure 8:
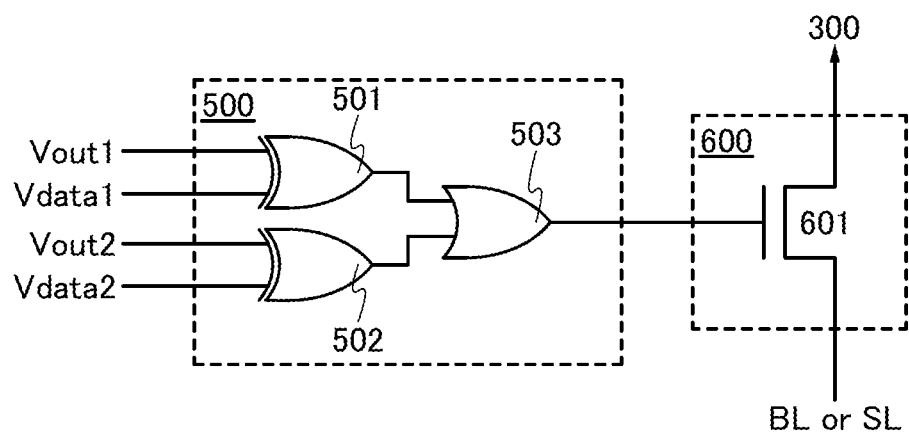
FIG. 8 is a circuit diagram illustrating a configuration example of a semiconductor device.

FIG. 8 illustrates a configuration example of the circuit 500 and the circuit 600.

The circuit 500 has a function of comparing data that is to be written to the circuit 101 with data read by the circuit 400 from the circuit 101. This means that the circuit 500 is a comparison and determination circuit having a function of determining whether writing data and reading data are consistent with each other. The circuit 500 includes an XOR gate 501, an XOR gate 502, and an OR gate 503.

The circuit 600 is a switch circuit having a function of controlling conduction between the circuit 300 and the wiring BL or the wiring SL. In this configuration example, a transistor 601 is used as the circuit 600.

The circuit 500 compares the potentials Vdata1 and Vdata2 corresponding to writing data with the potentials Vout1 and Vout2 corresponding to reading data to determine whether writing data and reading data are consistent with each other. In the case where writing data and reading data are not consistent with each other, a potential for turning on the transistor 601 is supplied to a gate of the transistor 601. While the transistor 601 is on, a gradually changing potential is supplied to the wiring SL or the wiring BL. Meanwhile, in the case where writing data and reading data are consistent with each other, a potential for turning off the transistor 601 is supplied to the gate of the transistor 601. When the transistor 601 is turned off, a gradually changing potential stops being supplied to the wiring SL or the wiring BL; thus, the potential of the wiring SL or the wiring BL is fixed to a constant value. The fixed potential is supplied to the circuit 101 as the writing potential. With the use of the potential of the wiring SL or the wiring BL at the time of accurate data writing as the writing potential in such a manner, data can be accurately written to the circuit 101.

Note that an OS transistor can be used as the transistor 601, in which case current that flows between the circuit 300 and the wiring BL or the wiring SL while the transistor is off can be extremely low. Thus, a change in potential output from the circuit 300 can be prevented from being transmitted to the wiring BL or the wiring SL, leading to prevention of the potential change of the wiring BL or the wiring SL.

Note that there is no particular limitation on the configurations of the circuits 300, 400, 500, and 600 illustrated in FIG. 6 to FIG. 8 as long as functions similar to those described above are obtained.

As described above, data reading from the circuit 101 and data writing to the circuit 101 can be performed at the same time by the circuits 300, 400, 500, and 600; thus, data can be written while writing data and reading data are checked whether they are consistent with each other. Accordingly, data can be accurately written, providing a highly reliable semiconductor device.

This embodiment can be combined with any other embodiment as appropriate.

(Embodiment 3)

In this embodiment, the structure of a transistor that can be used in the semiconductor device 10 will be described.

FIGS. 9A to 9D illustrate an example of a method for manufacturing a semiconductor device in which a transistor 720 and a transistor 730 are stacked. Here, the transistor 720 is a transistor including a single crystal semiconductor in its channel formation region and the transistor 730 is an OS transistor.

Figure 9A:
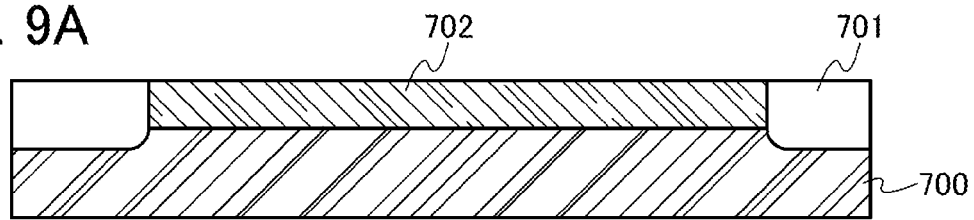
FIGS. 9A to 9D illustrate an example of a manufacturing process of a semiconductor device.

First, an element isolation insulator 701 and an n-type well 702 are formed in a substrate 700 containing a single crystal semiconductor (FIG. 9A).

Next, a gate insulating film 703 and a gate electrode 704 are formed, and a p-type impurity region 705 is formed in the well 702. A layer which includes a higher conductivity material (such as silicide) than the impurity region 705 may be stacked over the impurity region 705. The impurity region 705 may include an extension region.

Next, an insulating layer 706 is formed. The insulating layer 706 may be a single layer or a multilayer. The insulating layer 706 is preferably capable of supplying oxygen to a layer provided over the insulating layer 706 and blocking the entry of hydrogen and water from a layer provided below the insulating layer 706 to the layer provided over the insulating layer 706. The insulating layer 706 is etched and planarized until the gate electrode 704 is exposed. Note that the planarization of the insulating layer 706 can be performed by chemical mechanical polishing (CMP) or the like.

Figure 9B:
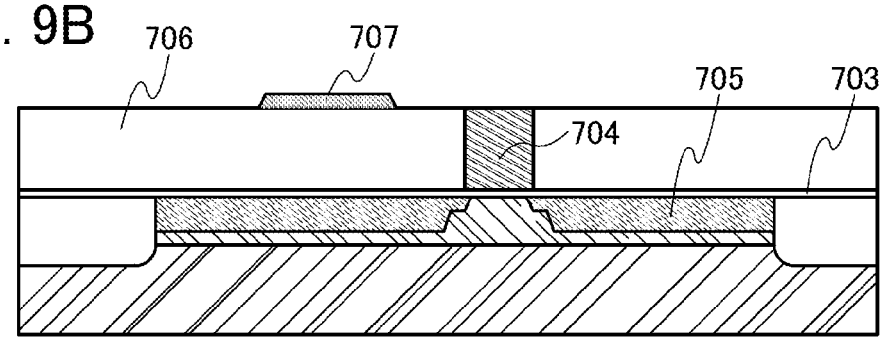

Next, an oxide semiconductor layer 707 is formed over the insulating layer 706 (FIG. 9B). The oxide semiconductor layer 707 can be formed using a material described in Embodiment 4, for example.

After that, a conductive film is formed over the insulating layer 706 and the oxide semiconductor layer 707. The conductive film may be a single layer or a multilayer. Then, the conductive film is etched to be a conductive layer 708. The conductive layer 708 serves as a source electrode or a drain electrode of a transistor having a channel formation region in the oxide semiconductor layer 707.

Figure 9C:
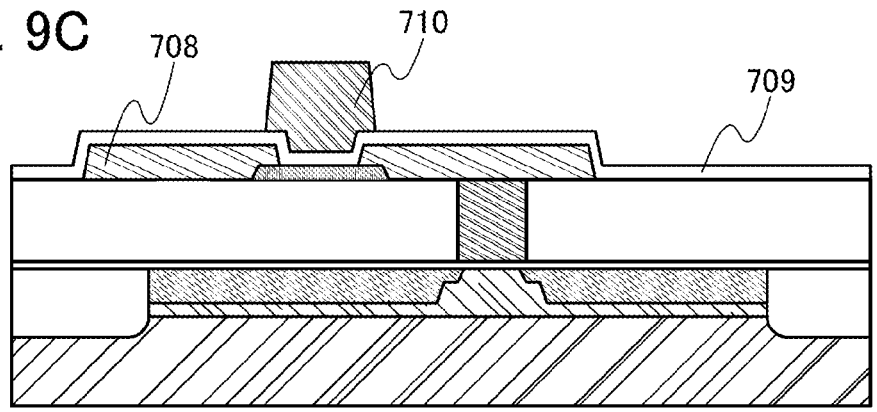

Next, a gate insulating film 709 is formed to cover the conductive layer 708. Furthermore, a conductive film is formed over the gate insulating film 709. The conductive film may be a single layer or a multilayer. The conductive film is preferably capable of blocking the entry and hydrogen or water from a layer provided over the conductive film to a layer provided below the conductive film. Then, the conductive film is etched to be a gate electrode 710 (FIG. 9C).

Figure 9D:
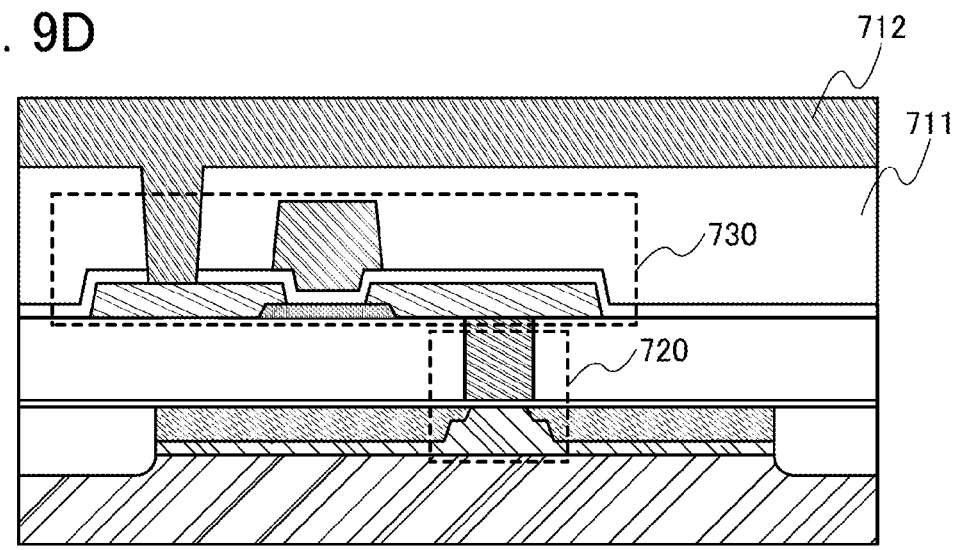

Subsequently, an insulating layer 711 is formed. A contact hole reaching the conductive layer 708 is formed in the insulating layer 711 and the gate insulating film 709, and then is filled with a conductive material, whereby a wiring 712 is formed (FIG. 9D). Alternatively, another conductive layer in contact with the conductive layer 708 may be formed in the contact hole, and the conductive layer and the wiring 712 may be in contact with each other. Note that the wiring 712 may be a single layer or a multilayer.

In this manner, the semiconductor device in which the transistor 720 including a single crystal semiconductor in its channel formation region and the transistor 730 that is an OS transistor are stacked can be manufactured.

In FIG. 9D, the gate electrode 704 is connected to the conductive layer 708. That is, a gate of the transistor 720 is connected to one of a source and a drain of the transistor 730. Such a structure can be appropriately used for the circuits illustrated in FIG. 1, FIG. 2A, FIG. 3A, FIG. 4A, FIG. 5A, FIG. 6, FIG. 7, and FIG. 8. For example, the transistor 720 can be used as the transistor 103 illustrated in FIG. 1, FIG. 2A, FIG. 3A, FIG. 4A, or FIG. 5A, and the like. The transistor 730 can be used as the transistor 102 illustrated in FIG. 1, FIG. 2A, FIG. 3A, FIG. 4A, or FIG. 5A, and the like.

Figure 10A:
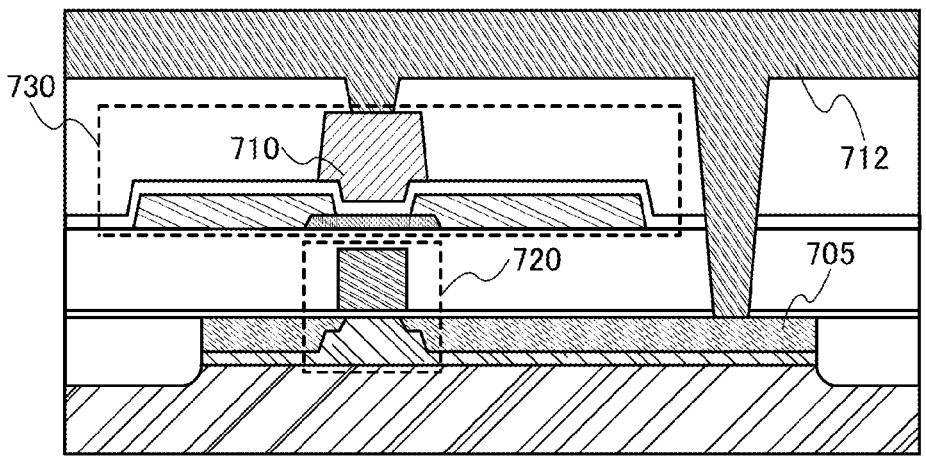
FIGS. 10A to 10C each illustrate a structure example of transistors.

The connection relation of the transistors 720 and 730 is not limited to that illustrated in FIG. 9D. For example, as illustrated in FIG. 10A, the impurity region 705 may be connected to the gate electrode 710 through the wiring 712. Accordingly, one of a source and a drain of the transistor 720 may be connected to a gate of the transistor 730.

Figure 10B:
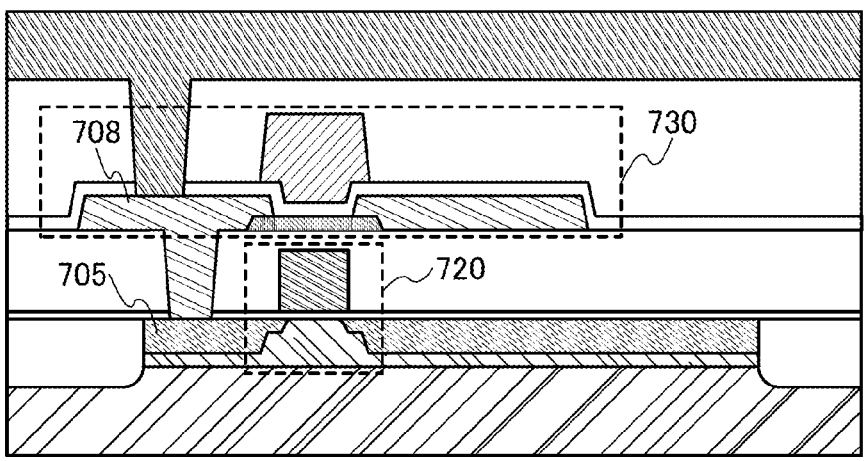
Figure 10C:
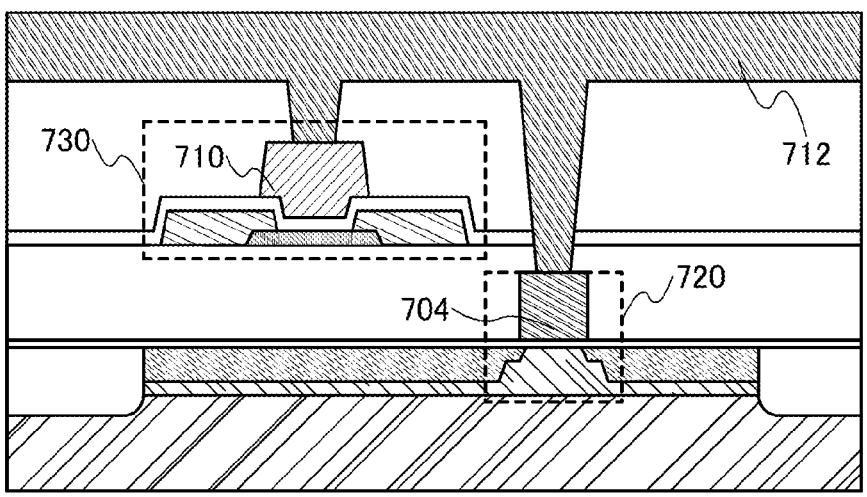

Alternatively, the impurity region 705 may be connected to the conductive layer 708 as illustrated in FIG. 10B, in which case one of the source and the drain of the transistor 720 can be connected to one of the source and the drain of the transistor 730. Such a structure can be appropriately used for the circuits illustrated in FIG. 1, FIG. 2A, FIG. 3A, FIG. 4A, FIG. 5A, FIG. 6, FIG. 7, and FIG. 8, and the like. For example, the transistor 720 can be used as the transistor 103 illustrated in FIG. 1, FIG. 2A, FIG. 3A, FIG. 4A, or FIG. 5A, the transistor 312 illustrated in FIG. 6, and the like. The transistor 730 can be used as the switches S1 to Si illustrated in FIG. 6, the transistor 431 illustrated in FIG. 7, the transistor 601 illustrated in FIG. 8, and the like. Further alternatively, the gate electrode 704 may be connected to the gate electrode 710 through the wiring 712 as illustrated in FIG. 10C, in which case the gate of the transistor 720 can be connected to the gate of the transistor 730. Such a structure is effective particularly in the case where the inverter illustrated in FIG. 6 or FIG. 7 is formed using an OS transistor and a transistor containing a single crystal semiconductor in its channel formation region.

In each of FIG. 9D and FIGS. 10A to 10C, the transistor 720 and the transistor 730 may have mutually overlapping regions with the insulating layer 706 provided therebetween. For example, as illustrated in FIG. 9D and FIG. 10C, the impurity region 705 of the transistor 720 and a channel formation region of the transistor 730 may have mutually overlapping regions with the insulating layer 706 provided therebetween. Alternatively, as illustrated in FIGS. 10A and 10B, the channel formation region of the transistor 720 and the channel formation region of the transistor 730 may have mutually overlapping regions with the insulating layer 706 provided therebetween. Further alternatively, the gate electrode 704 of the transistor 720 and the gate electrode 710 of the transistor 730 may have mutually overlapping regions with the insulating layer 706 provided therebetween. With any of these structures, the integration degree of the transistors can be increased; thus, the area of the semiconductor device 10 can be reduced.

This embodiment can be implemented in appropriate combination with any of the other embodiments.

(Embodiment 4)

In this embodiment, the structures of a transistor that can be used in the memory circuit or a logic circuit will be described.

<Example of Cross-Sectional Structure of Semiconductor Device>

Figure 11:
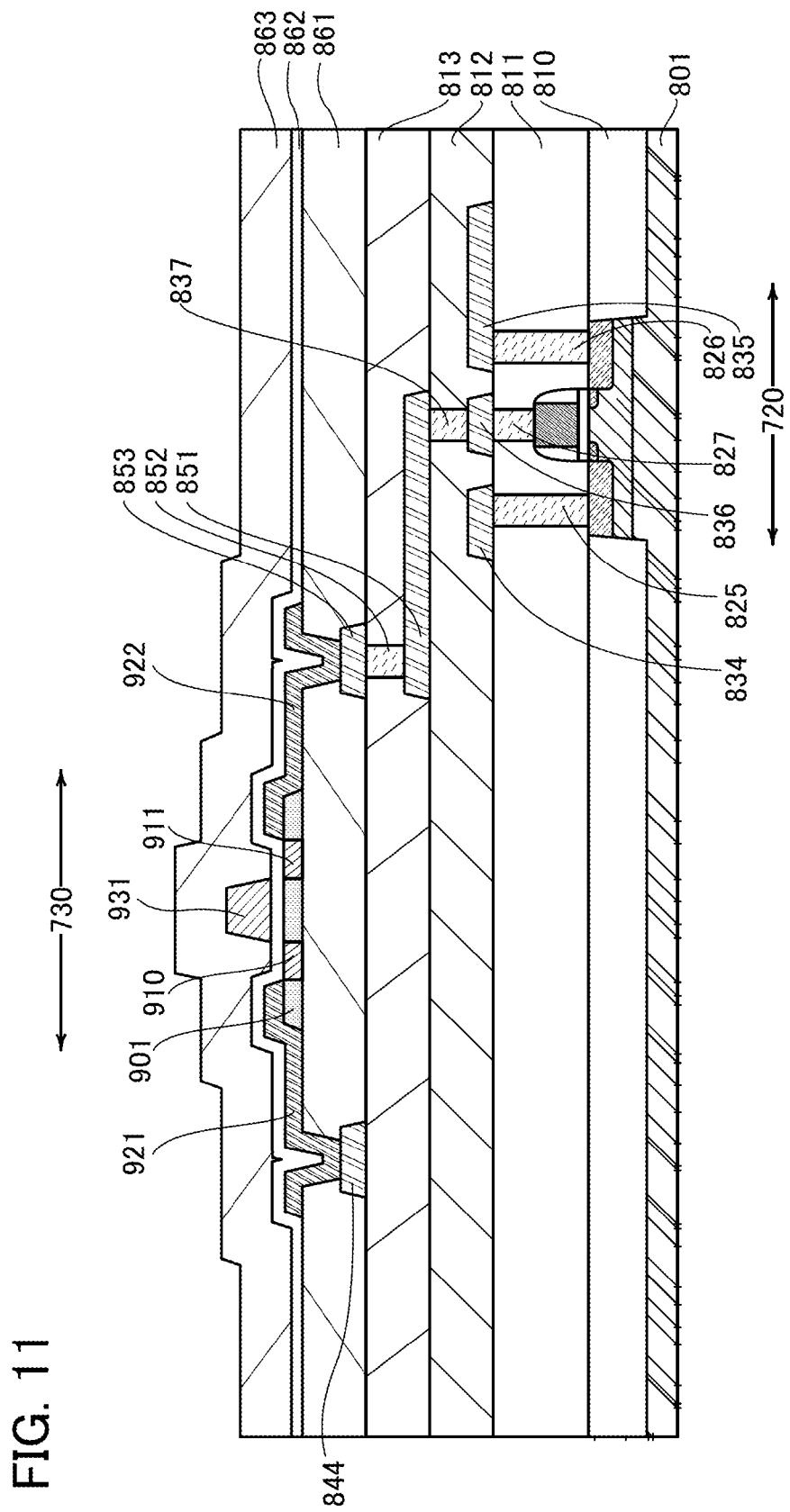
FIG. 11 illustrates a structure example of transistors.

FIG. 11 illustrates a structure example of the transistors 720 and 730. In FIG. 11, the transistor 730 that is an OS transistor is formed over the transistor 720 that is a transistor including a material other than an oxide semiconductor in its channel formation region.

Note that such a structure in which the transistor including a material other than an oxide semiconductor and the OS transistor are stacked can be appropriately used for any of transistors included in the various circuits illustrated in FIG. 1, FIG. 2A, FIG. 3A, FIG. 4A, FIG. 5A, FIG. 6, FIG. 7, and FIG. 8.

In this embodiment, as in FIG. 9D, the gate of the transistor 720 is connected to one of the source and the drain of the transistor 730; however, the structure of the present invention is not limited to this. One of the source and the drain of the transistor 720 may be connected to the gate of the transistor 730 (see FIG. 10A), one of the source and the drain of the transistor 720 may be connected to one of the source and the drain of the transistor 730 (see FIG. 10B), or the gate of the transistor 720 may be connected to the gate of the transistor 730 (see FIG. 10C).

The transistor 720 may include its channel formation region in a semiconductor film or a semiconductor substrate of silicon, germanium, or the like in an amorphous, microcrystalline, polycrystalline, or single crystal state. Alternatively, the transistor 720 may include its channel formation region in an oxide semiconductor film or an oxide semiconductor substrate. In the case where channel formation regions of all the transistors are included in an oxide semiconductor film or an oxide semiconductor substrate, the transistor 730 is not necessarily stacked over the transistor 720, and the transistors 730 and 720 may be formed in the same layer.

In the case where the transistor 720 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 801 where the transistor 720 is formed can be, for example, a silicon substrate, a germanium substrate, or a silicon germanium substrate. FIGS. 9A to 9D show the case where a single crystal silicon substrate is used as the semiconductor substrate 801.

The transistor 720 is electrically isolated by element isolation. As the element isolation method, a local oxidation of silicon (LOCOS) method, a shallow trench isolation (STI) method, or the like can be employed. FIG. 11 illustrates an example where the shallow trench isolation method is used to electrically isolate the transistor 720. Specifically, in FIG. 11, the transistor 720 is electrically isolated by element isolation using an element isolation region 810 formed in such a manner that an insulator including silicon oxide or the like is buried in a trench formed in the semiconductor substrate 801 by etching or the like.

An insulating film 811 is provided over the transistor 720. Opening portions are formed in the insulating film 811. Conductive films 825 and 826 that are electrically connected to the source and the drain of the transistor 720 and a conductive film 827 that is electrically connected to the gate of the transistor 720 are formed in the openings.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening is formed in the insulating film 812. A conductive film 837 electrically connected to the conductive film 836 is formed in the opening portion. The conductive film 837 is electrically connected to a conductive film 851 formed over the insulating film 812.

An insulating film 813 is formed over the conductive film 851. An opening is formed in the insulating film 813. A conductive film 852 electrically connected to the conductive film 851 is formed in the opening. The conductive film 852 is electrically connected to a conductive film 853 formed over the insulating film 813. A conductive film 844 is formed over the insulating film 813.

An insulating film 861 is formed over the conductive film 853 and the conductive film 844. In FIG. 11, the transistor 730 is formed over the insulating film 861.

The transistor 730 includes, over the insulating film 861, a semiconductor film 901 including an oxide semiconductor, conductive films 921 and 922 functioning as source and drain over the semiconductor film 901, a gate insulating film 862 over the semiconductor film 901 and the conductive films 921 and 922, and a gate electrode 931 overlapping with the semiconductor film 901 over the gate insulating film 862 and between the conductive films 921 and 922. Note that the conductive film 922 is electrically connected to the conductive film 853 in an opening provided in the insulating film 861.

In the semiconductor film 901 of the transistor 730, there is a region 910 between a region overlapping with the conductive film 921 and a region overlapping with the gate electrode 931. In addition, in the semiconductor film 901 of the transistor 730, there is a region 911 between a region overlapping with the conductive film 922 and the region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as masks, the resistivity of the regions 910 and 911 can be made lower than that of the region overlapping with the gate electrode 931 in the semiconductor film 901.

An insulating film 863 is provided over the transistor 730.

In FIG. 11, the transistor 730 has the gate electrode 931 on at least one side of the semiconductor film 901; alternatively, the transistor 730 may have a pair of gate electrodes with the semiconductor film 901 positioned therebetween.

In the case where the transistor 730 has a pair of gate electrodes with the semiconductor film 901 positioned therebetween, one of the gate electrodes may be supplied with a signal for controlling conduction, and the other of the gate electrodes may be supplied with a potential from another wiring. In this case, potentials at the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 11, the transistor 730 has a single-gate structure where one channel formation region corresponding to one gate electrode 931 is provided. However, the transistor 730 may have a multi-gate structure where a plurality of channel formation regions are formed in one active layer by providing a plurality of gate electrodes electrically connected to each other.

<Transistor>

Then, structure examples of the OS transistor will be described.

Figure 12A:
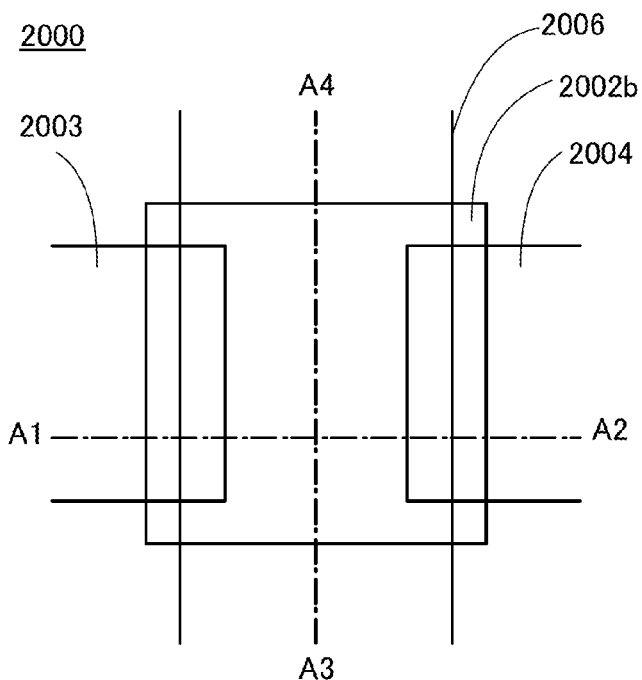
FIGS. 12A to 12C illustrate a structure example of a transistor.
Figure 12C:
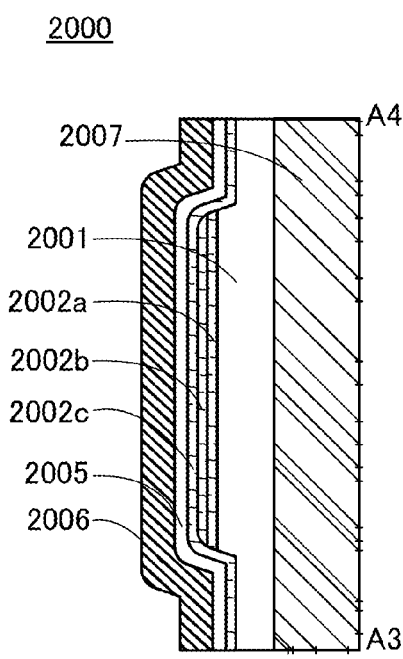
Figure 12B:
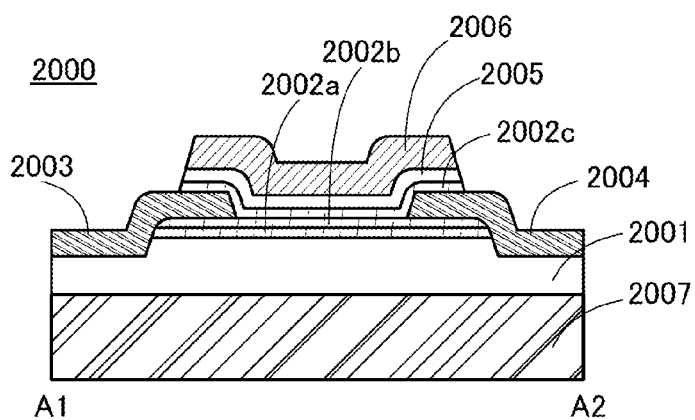

FIGS. 12A to 12C illustrate an example of a transistor 2000 that is an OS transistor. FIG. 12A is a top view of the transistor 2000. Note that insulating films are not illustrated in FIG. 12A in order to clarify the layout of the transistor 2000. FIG. 12B is a cross-sectional view along the dashed-dotted line A1-A2 in the top view in FIG. 12A. FIG. 12C is a cross-sectional view along the dashed-dotted line A3-A4 in the top view in FIG. 12A.

As illustrated in FIGS. 12A to 12C, the transistor 2000 includes an oxide semiconductor film 2002a and an oxide semiconductor film 2002b that are stacked in this order over an insulating film 2001 formed over a substrate 2007; a conductive film 2003 and a conductive film 2004 that are electrically connected to the oxide semiconductor film 2002b and have functions as a source electrode and a drain electrode; an oxide semiconductor film 2002c over the oxide semiconductor film 2002b, the conductive film 2003, and the conductive film 2004; an insulating film 2005 that has a function as a gate insulating film and is located over the oxide semiconductor film 2002c; and a conductive film 2006 that has a function as a gate electrode, lies over the insulating film 2005, and overlaps with the oxide semiconductor films 2002a to 2002c. Note that the substrate 2007 may be a glass substrate, a semiconductor substrate, or the like or may be an element substrate where semiconductor elements are formed over a glass substrate or on a semiconductor substrate.

Figure 13A:
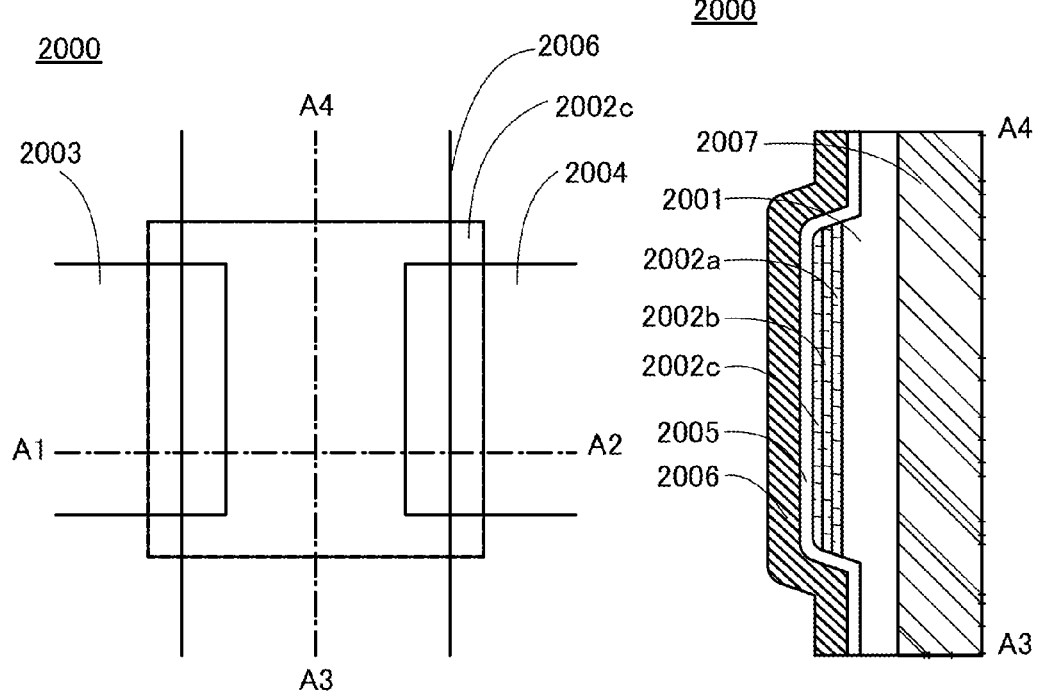
FIGS. 13A to 13C illustrate a structure example of a transistor.
Figure 13C:
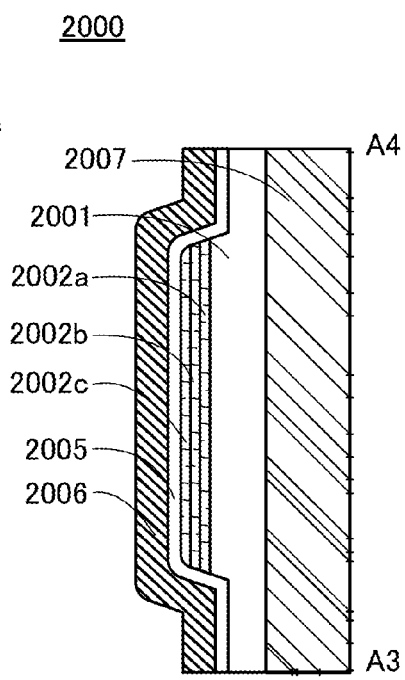
Figure 13B:
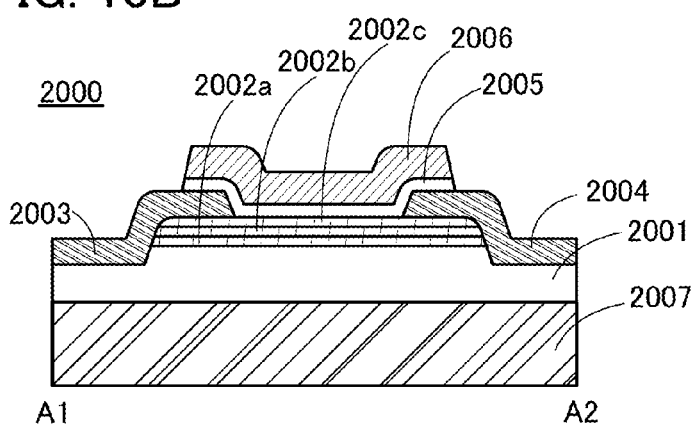

FIGS. 13A to 13C illustrate another specific example of the structure of the transistor 2000. FIG. 13A is a top view of the transistor 2000. Note that insulating films are not illustrated in FIG. 13A in order to clarify the layout of the transistor 2000. FIG. 13B is a cross-sectional view along the dashed-dotted line A1-A2 in the top view in FIG. 13A. FIG. 13C is a cross-sectional view along the dashed-dotted line A3-A4 in the top view in FIG. 13A.

As illustrated in FIGS. 13A to 13C, the transistor 2000 includes the oxide semiconductor films 2002a to 2002c that are stacked in this order over the insulating film 2001; the conductive films 2003 and 2004 that are electrically connected to the oxide semiconductor film 2002c and have functions as a source electrode and a drain electrode; the insulating film 2005 that has a function as a gate insulating film and is located over the oxide semiconductor film 2002c and the conductive films 2003 and 2004; and a conductive film 2006 that has a function as a gate electrode, lies over the insulating film 2005, and overlaps with the oxide semiconductor films 2002a to 2002c.

FIGS. 12A to 12C and FIGS. 13A to 13C each illustrate the structural example of the transistor 2000 in which the oxide semiconductor films 2002a to 2002c are stacked. However, the structure of the oxide semiconductor film included in the transistor 2000 is not limited to a stacked-layer structure including a plurality of oxide semiconductor films and may be a single-layer structure.

In the case where the transistor 2000 includes the semiconductor film in which the semiconductor films 2002a to 2002c are stacked in this order, each of the oxide semiconductor films 2002a and 2002c is an oxide film that contains at least one of metal elements contained in the oxide semiconductor film 2002b and in which energy at the conduction band minimum is closer to the vacuum level than that in the oxide semiconductor film 2002b by higher than or equal to 0.05 eV, 0.07 eV, 0.1 eV, or 0.15 eV and lower than or equal to 2 eV, 1 eV, 0.5 eV, or 0.4 eV. The oxide semiconductor film 2002b preferably contains at least indium because carrier mobility is increased.

When the transistor 2000 includes the semiconductor film with the above structure, when an electric field is applied to the semiconductor film by applying voltage to the gate electrode, a channel region is formed in the oxide semiconductor film 2002b, which has the lowest conduction band energy among the oxide semiconductor films. That is, the oxide semiconductor film 2002c provided between the oxide semiconductor film 2002b and the insulating film 2005 makes it possible to form the channel region in the oxide semiconductor film 2002b, which is separated from the insulating film 2005.

Since the oxide semiconductor film 2002c contains at least one of the metal elements contained in the oxide semiconductor film 2002b, interface scattering is unlikely to occur at the interface between the oxide semiconductor film 2002b and the oxide semiconductor film 2002c. Thus, the movement of carriers is unlikely to be inhibited at the interface, which results in an increase in the field-effect mobility of the transistor 2000.

When an interface state is formed at an interface between the oxide semiconductor films 2002b and 2002a, a channel region is also formed in a region close to the interface; thus, the threshold voltage of the transistor 2000 varies. However, since the oxide semiconductor film 2002a contains at least one of metal elements contained in the oxide semiconductor film 2002b, an interface state is unlikely to be formed at the interface between the oxide semiconductor film 2002b and the oxide semiconductor film 2002a. As a result, such a structure can reduce variations in electrical characteristics (e.g., threshold voltage) of the transistor 2000.

Furthermore, it is preferable that a plurality of oxide semiconductor films be stacked so that an interface level due to an impurity existing between the oxide semiconductor films, which inhibits carrier flow, is not formed at an interface between the oxide semiconductor films. This is because when an impurity exists between the stacked oxide semiconductor films the continuity of the energies of the bottoms of the conduction bands of the oxide semiconductor films is lost, and carriers are trapped or disappear by recombination in the vicinity of the interface. By reducing an impurity existing between the films, a continuous junction (here, in particular, a well structure having a U shape in which energies of the bottoms of the conduction bands are changed continuously between the films) is formed easily as compared with the case of merely stacking the plurality of oxide semiconductor films which contain at least one common metal as a main component.

In order to form such a continuous energy band, it is necessary to form films continuously without being exposed to air, with use of a multi-chamber deposition apparatus (sputtering apparatus) including a load lock chamber. Each chamber of the sputtering apparatus is preferably evacuated to a high vacuum (to $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, and further preferably $-100°$ C. or lower and is highly purified, moisture and the like can be prevented from entering the oxide semiconductor film as much as possible. In the case where the oxide semiconductor film 2002b is formed of an In-M-Zn oxide (M is Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor film 2002b, $x_1/y_1$ is preferably greater than or equal to ⅓ and less than or equal to 6 and further preferably greater than or equal to 1 and less than or equal to 6, and $z_1/y_1$ is preferably greater than or equal to ⅓ and less than or equal to 6 and further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 2002b is easily formed. Typical examples of the atomic ratio of the metal elements of the target are In:M:Zn=1:1:1 and In:M:Zn=3:1:2. Note that the CAAC-OS will be described in detail later.

In the case where the oxide semiconductor films 2002a and 2002c each contain an In-M-Zn oxide (M is Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 2002a and 2002c, $x_2/y_2$ is preferably less than $x_1/y_1$, and $z_2/y_2$ is preferably greater than or equal to ⅓ and less than or equal to 6 and further preferably greater than or equal to 1 and less than or equal to 6. Note that when $z_2/y_2$ is greater than or equal to 1 and less than or equal to 6, CAAC-OS films are easily formed as the oxide semiconductor films 2002a and 2002c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 2002a and the oxide semiconductor film 2002c each have a thickness of greater than or equal to 3 nm and less than or equal to 100 nm, preferably greater than or equal to 3 nm and less than or equal to 50 nm. The oxide semiconductor film 2002b has a thickness of greater than or equal to 3 nm and less than or equal to 200 nm, preferably greater than or equal to 3 nm and less than or equal to 100 nm, and further preferably greater than or equal to 3 nm and less than or equal to 50 nm.

The three semiconductor films (the oxide semiconductor films 2002a to 2002c) can be either amorphous or crystalline. However, when the oxide semiconductor film 2002b where a channel region is formed is crystalline, the transistor 2000 can have stable electrical characteristics; thus, the oxide semiconductor film 2002b is preferably crystalline.

Note that a channel formation region refers to a region of the semiconductor film of the transistor 2000, which overlaps with a gate electrode and which is between a source electrode and a drain electrode. Furthermore, a channel region refers to a region through which current mainly flows in the channel formation region.

For example, when an In—Ga—Zn oxide film formed by a sputtering method is used as each of the oxide semiconductor films 2002a and 2002c, the oxide semiconductor films 2002a and 2002c can be deposited with the use of an In—Ga—Zn oxide target containing In, Ga, and Zn with an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 2002b is a CAAC-OS film, the oxide semiconductor film 2002b is preferably deposited with the use of a polycrystalline In—Ga—Zn oxide containing In, Ga, and Zn with an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 2002b is a CAAC-OS film, the oxide semiconductor film 2002b may be deposited with the use of an In—Ga—Zn oxide target with an atomic ratio of 2:1:3. In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

Note that the oxide semiconductor films 2002a to 2002c can be formed using a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; thus, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1 \times 10^6$ µm and a channel length of 10 µm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current standardized on the channel width of the transistor is lower than or equal to 100 zA/µm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yoctoamperes per micrometer (yA/μm) is obtained. Accordingly, the off-state current of the transistor in which the purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. In addition, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Furthermore, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 2000, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 2000, achieving the high-speed operation of a semiconductor device using the transistor 2000.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 2000, the n-type region preferably extends to the oxide semiconductor film 2002b serving as a channel region in order that the mobility and on-state current of the transistor 2000 can be further increased and the semiconductor device can operate at a higher speed.

The insulating film 2001 preferably has a function of supplying part of oxygen to the oxide semiconductor films 2002a to 2002c by heating. It is preferable that the number of defects in the insulating film 2001 be small, and typical spin density at g=2.001 due to a dangling bond of silicon be lower than or equal to $1 \times 10^{18}$ spins/cm$^3$. The spin density is measured by electron spin resonance (ESR) spectroscopy.

The insulating film 2001, which has a function of supplying part of oxygen to the oxide semiconductor films 2002a to 2002c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 2001 can be formed by a plasma CVD method, a sputtering method, or the like.

Note that in this specification, oxynitride contains more oxygen than nitrogen, and nitride oxide contains more nitrogen than oxygen.

Note that in the transistor 2000 illustrated in FIGS. 12A to 12C and FIGS. 13A to 13C, the conductive film 2006 overlaps with end portions of the oxide semiconductor film 2002b including a channel region that do not overlap with the conductive films 2003 and 2004, i.e., end portions of the oxide semiconductor film 2002b that are in a region different from a region where the conductive films 2003 and 2004 are located. When the end portions of the oxide semiconductor film 2002b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 2006 because the end portions of the oxide semiconductor film 2002b that do not overlap with the conductive films 2003 and 2004 overlap with the conductive film 2006 in the transistor 2000 illustrated in FIGS. 12A to 12C and FIGS. 13A to 13C. Consequently, current that flows between the conductive films 2003 and 2004 through the end portions of the oxide semiconductor film 2002b can be controlled by the potential applied to the conductive film 2006. Such a structure of the transistor 2000 is referred to as a surrounded channel (s-channel) structure.

With the s-channel structure, specifically, when a potential at which the transistor 2000 is turned off is supplied to the conductive film 2006, the amount of off-state current that flows between the conductive films 2003 and 2004 through the end portions can be reduced. For this reason, in the transistor 2000, even when the distance between the conductive films 2003 and 2004 at the end portions of the oxide semiconductor film 2002b is reduced as a result of reducing the channel length to obtain high on-state current, the transistor 2000 can have a low off-state current. Consequently, with the short channel length, the transistor 2000 can have a high on-state current when in an on state and a low off-state current when in an off state.

With the s-channel structure, specifically, when a potential at which the transistor 2000 is turned on is supplied to the conductive film 2006, the amount of current that flows between the conductive films 2003 and 2004 through the end portions of the oxide semiconductor film 2002b can be increased. The current contributes to an increase in the field-effect mobility and an increase in the on-state current of the transistor 2000. When the end portions of the oxide semiconductor film 2002b overlap with the conductive film 2006, carriers flow in a wide region of the oxide semiconductor film 2002b without being limited to a region in the vicinity of the interface between the oxide semiconductor film 2002b and the insulating film 2005, which results in an increase in the amount of carrier movement in the transistor 2000. As a result, the on-state current of the transistor 2000 is increased, and the field-effect mobility is increased to greater than or equal to $10\ cm^2/V·s$ or to greater than or equal to $20\ cm^2/V·s$, for example. Note that here, the field-effect mobility is not an approximate value of the mobility as the physical property of the oxide semiconductor film but is the field-effect mobility in a saturation region of the transistor.

Figure 14A:
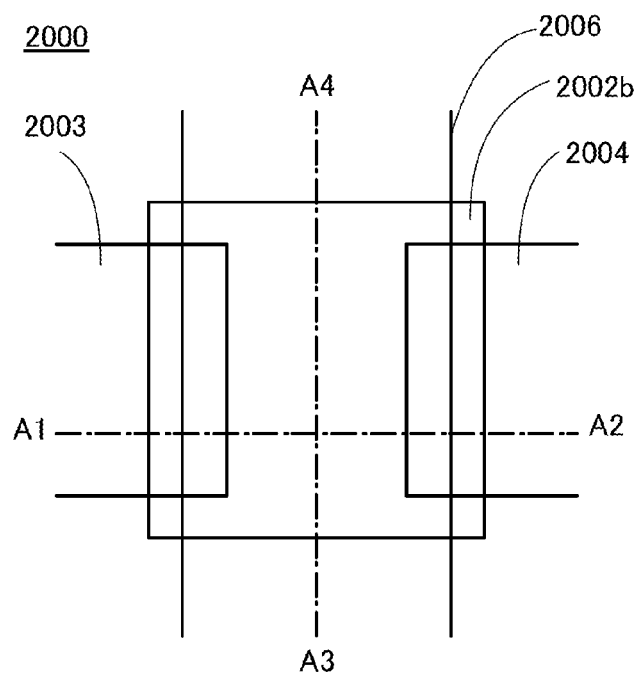
FIGS. 14A to 14C illustrate a structure example of a transistor.
Figure 14C:
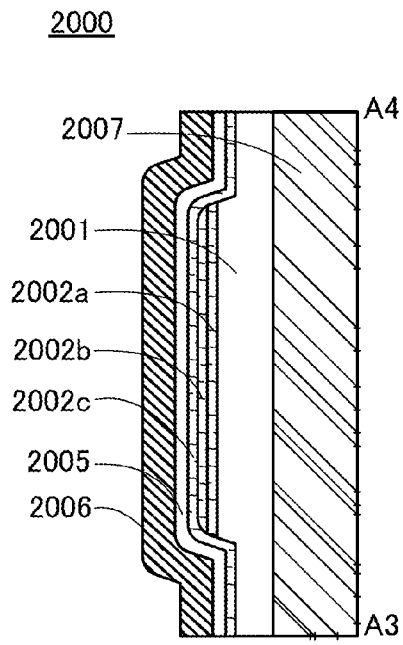
Figure 14B:
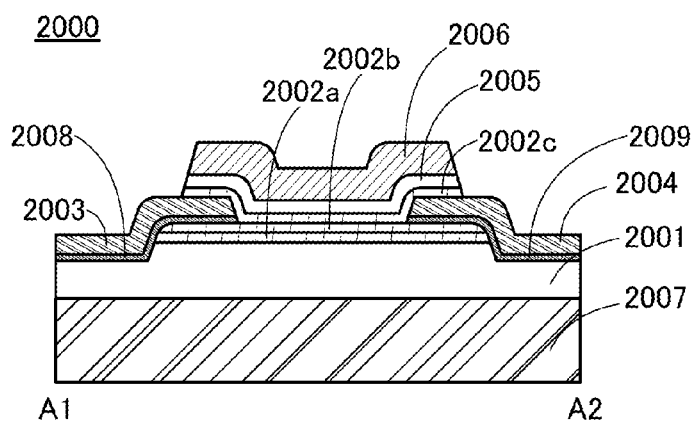

The transistor 2000 may have a structure illustrated in FIGS. 14A to 14C. The transistor 2000 illustrated in FIGS. 14A to 14C includes a layer 2008 between the oxide semiconductor film 2002b and the conductive film 2003, and a layer 2009 between the oxide semiconductor film 2002b and the conductive film 2004. Each of the layers 2008 and 2009 can be provided so as to be in contact with a side surface of the oxide semiconductor film 2002a and a side surface of the oxide semiconductor film 2002b.

The layers 2008 and 2009 may be formed using a transparent conductor, an oxide semiconductor, a nitride semiconductor, or an oxynitride semiconductor, for example. The layers 2008 and 2009 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layers 2008 and 2009 may have a property of transmitting visible light. Alternatively, the layers 2008 and 2009 may have a property of not transmitting visible light, ultraviolet light, infrared light, or X-rays by reflecting or absorbing it. Such a property can suppress a change in electrical characteristics of the transistor due to stray light.

The layers 2008 and 2009 may preferably be formed using a layer which does not form a Schottky barrier with the oxide semiconductor film 2002b or the like. Accordingly, on-state characteristics of the transistor can be improved.

Such a structure in which the layer 2008 or the layer 2009 is provided between the oxide semiconductor layer and the conductive film can be used for the transistors illustrated in FIGS. 9A to 9D, FIGS. 10A to 10C, FIG. 11, FIGS. 12A to 12C, and FIGS. 13A to 13C and a transistor illustrated in FIG. 15, which will be described later.

<Structure of Oxide Semiconductor Film>

A structure of an oxide semiconductor film will be described below. Note that in the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°. Furthermore, the trigonal and rhombohedral crystal systems are included in the hexagonal crystal system in this specification.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is assigned to the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electric characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electric characteristics in some cases.

With the use of the CAAC-OS film in a transistor, variation in the electrical characteristics of the transistor due to irradiation with visible light or ultraviolet light is small.

<Microcrystalline Oxide Semiconductor Film>

Next, a microcrystalline oxide semiconductor film is described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Thus, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is substantially equivalent to the lattice spacing (also referred to as d value) on the (009) plane, and is 0.29 nm according to crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Note that an oxide semiconductor may be a stacked film including two or more films of an amorphous oxide semiconductor film, an amorphous-like OS film, a microcrystalline oxide semiconductor film, and a CAAC-OS film, for example.

This embodiment can be implemented in appropriate combination with any of the other embodiments and the like.

(Embodiment 5)

In this embodiment, an example of a semiconductor device having a structure different from that in FIG. 11 will be described.

Figure 15:
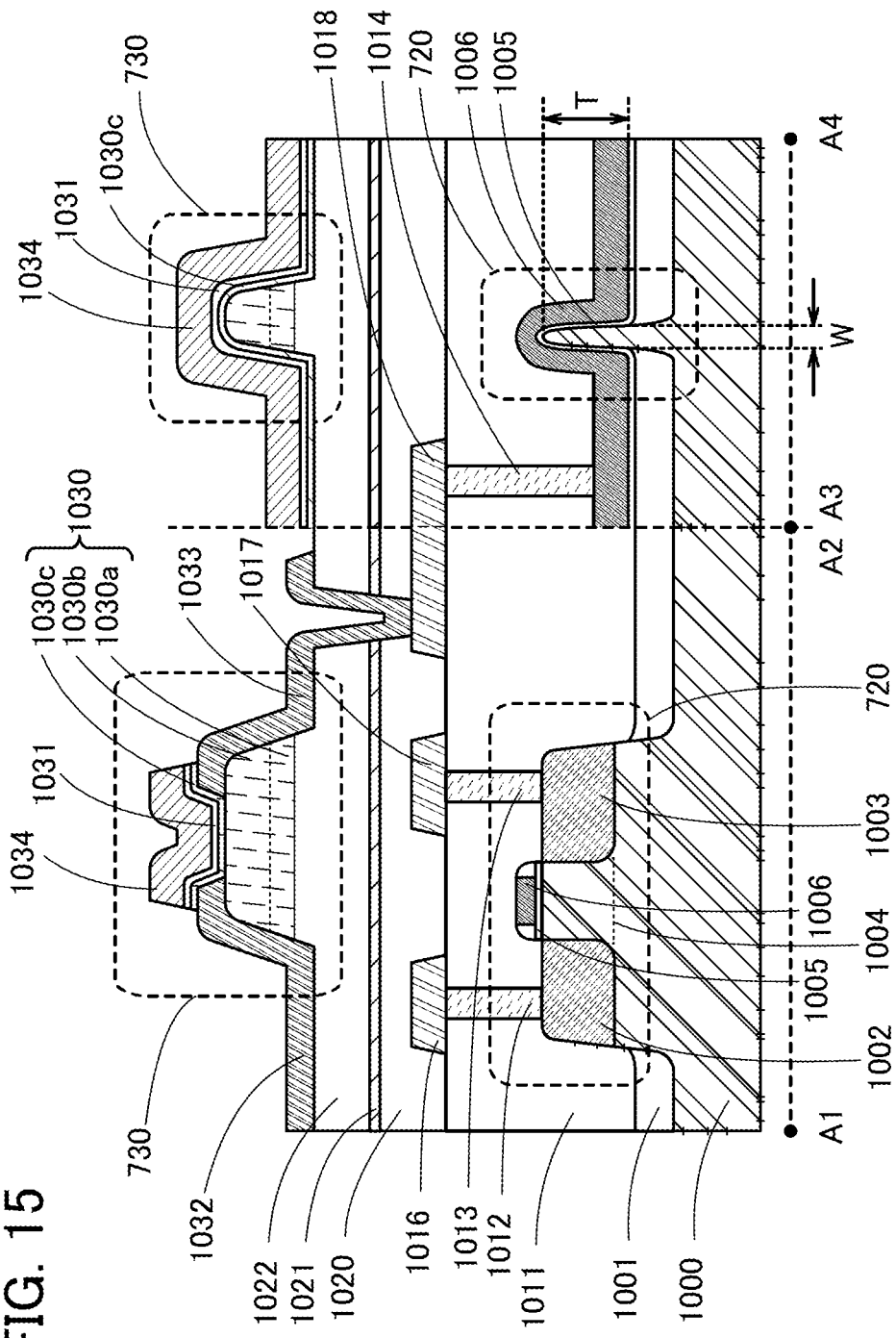
FIG. 15 illustrates a structure example of transistors.

FIG. 15 illustrates an example of a cross-sectional structure of a semiconductor device. In FIG. 15, a region along dashed line A1-A2 shows a structure of the transistors 720 and 730 in the channel length direction, and a region along dashed line A3-A4 shows a structure of the transistors 720 and 730 in the channel width direction. In one embodiment of the present invention, the channel length direction of the transistor 720 is not necessarily aligned with the channel length direction of the transistor 730.

The channel length direction refers to a direction in which a carrier moves between a source (source region or source electrode) and a drain (drain region or drain electrode), and the channel width direction refers to a direction perpendicular to the channel length direction in a plane parallel to a substrate.

FIG. 15 illustrates a structure example of the transistors 720 and 730. In FIG. 15, the transistor 730 that is an OS transistor is formed over the transistor 720 that is a transistor including a material other than an oxide semiconductor in its channel formation region.

Note that such a structure in which the transistor including a material other than an oxide semiconductor and the OS transistor are stacked can be appropriately used for any of transistors included in the various circuits illustrated in FIG. 1, FIG. 2A, FIG. 3A, FIG. 4A, FIG. 5A, FIG. 6, FIG. 7, and FIG. 8 and the transistors illustrated in FIGS. 9A to 9D, FIGS. 10A to 10C, FIG. 11, and FIGS. 12A to 12C.

In this embodiment, as in FIG. 9D, the gate of the transistor 720 is connected to one of the source and the drain of the transistor 730; however, the structure of the present invention is not limited to this. One of the source and the drain of the transistor 720 may be connected to the gate of the transistor 730 (see FIG. 10A), one of the source and the drain of the transistor 720 may be connected to one of the source and the drain of the transistor 730 (see FIG. 10B), or the gate of the transistor 720 may be connected to the gate of the transistor 730 (see FIG. 10C).

The transistor 720 may include its channel formation region in a semiconductor film or a semiconductor substrate of silicon, germanium, or the like in an amorphous, microcrystalline, polycrystalline, or single crystal state. Alternatively, the transistor 720 may include its channel formation region in an oxide semiconductor film or an oxide semiconductor substrate. In the case where channel formation regions of all the transistors are included in an oxide semiconductor film or an oxide semiconductor substrate, the transistor 730 is not necessarily stacked over the transistor 720, and the transistors 730 and 720 may be formed in the same layer.

In the case where the transistor 720 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 1000 where the transistor 720 is formed can be, for example, a silicon substrate, a germanium substrate, or a silicon germanium substrate. FIG. 15 shows the case where a single crystal silicon substrate is used as the substrate 1000.

The transistor 720 is electrically isolated by element isolation. As the element isolation method, a shallow trench isolation method or the like can be employed. FIG. 15 illustrates an example where the shallow trench isolation method is used to electrically isolate the transistor 720. Specifically, in FIG. 15, the transistor 720 is electrically isolated by element isolation using an element separation region 1001 formed in such a manner that an insulator including silicon oxide or the like is buried in a trench formed in the substrate 1000 by etching or the like and then the insulator is removed partly by etching or the like.

In a projection of the substrate 1000 that exists in a region other than the trench, an impurity region 1002 and an impurity region 1003 of the transistor 720 and a channel formation region 1004 placed between the impurity regions 1002 and 1003 are provided. Furthermore, the transistor 720 includes an insulating film 1005 covering the channel formation region 1004 and a gate electrode 1006 that overlaps with the channel formation region 1004 with the insulating film 1005 provided therebetween.

In the transistor 720, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Thus, the number of transferred carriers in the transistor 720 can be increased while an area over the substrate occupied by the transistor 720 is reduced. As a result, the on-state current and field-effect mobility of the transistor 720 are increased. Suppose the length in the channel width direction (channel width) of the projection in the channel formation region 1004 is W, and the thickness of the projection in the channel formation region 1004 is T. When the aspect ratio of the thickness T to the channel width W is high, a region where carriers flow becomes larger. Thus, the on-state current of the transistor 720 can be further increased and the field-effect mobility of the transistor 720 can be further increased.

Note that when the transistor 720 is formed using a bulk semiconductor substrate, the aspect ratio is desirably 0.5 or more, further desirably 1 or more.

An insulating film 1011 is provided over the transistor 720. Opening portions are formed in the insulating film 1011. Conductive films 1012 and 1013 that are electrically connected to the impurity regions 1002 and 1003, respectively, and a conductive film 1014 that is electrically connected to the gate electrode 1006 are formed in the opening portions.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 730 is provided over the insulating film 1022.

The transistor 730 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening is formed in the insulating films 1020 to 1022. The conductive film 1033 is connected to the conductive film 1018 in the opening.

Note that in FIG. 15, the transistor 730 includes at least the gate electrode 1034 on one side of the semiconductor film 1030, and may further include a gate electrode overlapping with the semiconductor film 1030 with the insulating film 1022 positioned therebetween.

In the case where each of the transistor 730 has a pair of gate electrodes, one of the gate electrodes may be supplied with a signal for controlling conduction, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 15, the transistor 730 has a single-gate structure where one channel formation region corresponding to one gate electrode 1034 is provided. However, the transistor 730 may have a multi-gate structure where a plurality of channel formation regions are formed in one active layer by providing a plurality of gate electrodes electrically connected to each other.

FIG. 15 illustrates an example in which the semiconductor film 1030 included in the transistor 730 includes oxide semiconductor films 1030$a$ to 1030$c$ that are stacked in this order over the insulating film 1022. Note that in one embodiment of the present invention, the semiconductor film 1030 of the transistor 730 may be formed using a single-layer metal oxide film.

Note that this embodiment can be implemented in appropriate combination with other embodiments.

(Embodiment 6)

The variety of films disclosed in the other embodiments, such as the conductive films, the semiconductor films, and the insulating films can be formed by a sputtering method or a plasma CVD method; however, such films may be formed by another method, e.g., a thermal CVD (chemical vapor deposition) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; thus, an ALD method makes it possible to accurately adjust a thickness and thus is suitable for manufacturing a minute FET.

The variety of films such as the conductive film, the semiconductor film, and the insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are sequentially introduced plural times, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are sequentially introduced plural times to form a Ga—O layer, and then a $Zn(CH_3)_2$ gas and an $O_3$ gas are sequentially introduced plural times to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be implemented in appropriate combination with other embodiments.

(Embodiment 7)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 16A to 16F illustrate specific examples of these electronic devices.

Figure 16A:
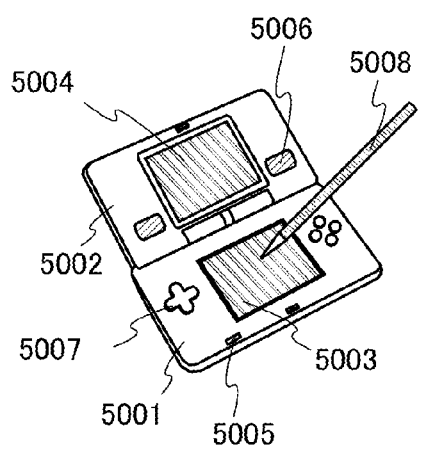
FIGS. 16A to 16F each illustrate an electronic device.

FIG. 16A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 16A has the two display portions 5003 and 5004, the number of display portions included in a portable game machine is not limited to this.

Figure 16B:
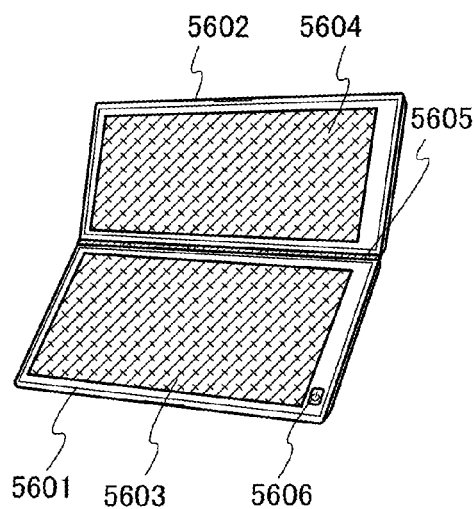

FIG. 16B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 16C:
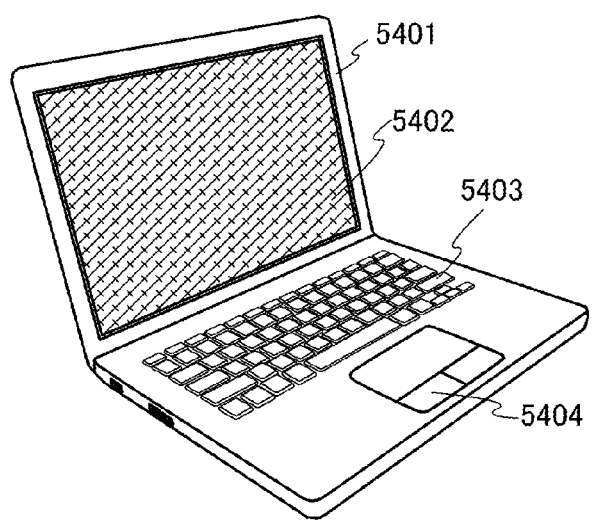

FIG. 16C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 16D:
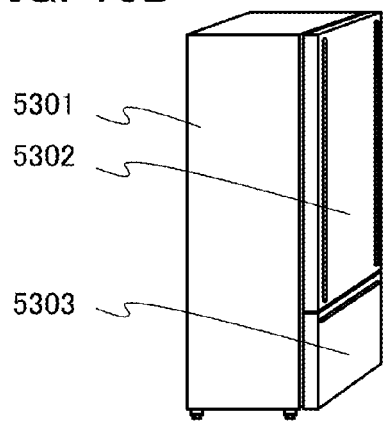

FIG. 16D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 16E:
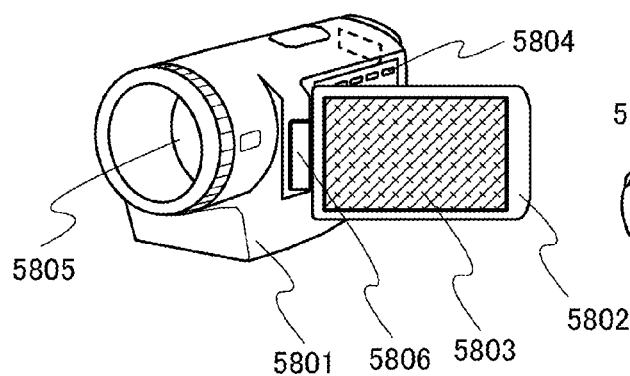

FIG. 16E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 16F:
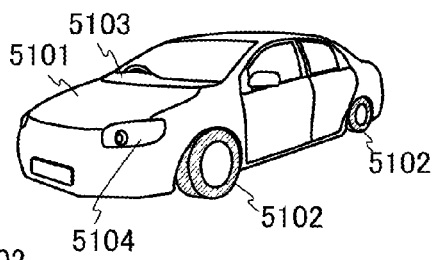

FIG. 16F illustrates a car including a car body 5101, wheels 5102, a dashboard 5103, lights 5104, and the like. The semiconductor device of one embodiment of the present invention can be used for a variety of integrated circuits included in cars.

This embodiment can be implemented in appropriate combination with any of the other embodiments.

This application is based on Japanese Patent Application serial no. 2014-111826 filed with Japan Patent Office on May 30, 2014, the entire contents of which are hereby incorporated by reference.

What is claimed is:

1. A semiconductor device comprising:
a first circuit comprising;
a first transistor comprising an oxide semiconductor in a channel formation region;
a second transistor; and
a capacitor;
a second circuit;
a third circuit; and
a fourth circuit,
wherein one of a source and a drain of the first transistor is electrically connected to a first wiring,
wherein the other of the source and the drain of the first transistor is electrically connected to a gate of the second transistor and a first electrode of the capacitor,
wherein one of a source and a drain of the second transistor is electrically connected to the first wiring,
wherein the other of the source and the drain of the second transistor is electrically connected to a second wiring,
wherein the third circuit is connected to the first circuit through the fourth circuit and one of the first wiring and the second wiring,
wherein the third circuit is configured to supply the one of the first wiring and the second wiring with a gradually changing potential,
wherein the second circuit is configured to compare first data to be written to the first circuit with second data obtained from a potential of the other of the first wiring and the second wiring, and determine whether the first data is consistent with the second data,
wherein the fourth circuit is configured to control conduction between the third circuit and the first circuit, and
wherein the fourth circuit is configured to disconnect the third circuit from the first circuit when the second circuit determines that the first data is consistent with the second data.

2. The semiconductor device according to claim 1, wherein a potential of the one of the first wiring and the second wiring at a time when the fourth circuit disconnects the third circuit from the first circuit is supplied to the gate of the second transistor.

3. The semiconductor device according to claim 1, wherein the gradually changing potential is a potential that decreases from a high power supply potential to a low power supply potential.

4. The semiconductor device according to claim 1, wherein the gradually changing potential is a potential that increases from a low power supply potential to a high power supply potential.

5. The semiconductor device according to claim 1, wherein the gradually changing potential is supplied to the one of the first wiring and the second wiring after a predetermined potential is supplied to the other of the first wiring and the second wiring.

6. The semiconductor device according to claim 1,
wherein the fourth circuit comprises a third transistor, and
wherein the third transistor comprises an oxide semiconductor in a channel formation region.

7. The semiconductor device according to claim 1, wherein the first circuit is a memory cell.

8. An electronic device comprising:
the semiconductor device according to claim 1, and
a display device, a speaker, or a microphone.

9. A semiconductor device comprising:
a first circuit comprising;
a first transistor comprising an oxide semiconductor in a channel formation region;
a second transistor; and
a capacitor;
a second circuit;
a third circuit;
a fourth circuit; and
a fifth circuit,
wherein one of a source and a drain of the first transistor is electrically connected to a first wiring,
wherein the other of the source and the drain of the first transistor is electrically connected to a gate of the second transistor and a first electrode of the capacitor,
wherein one of a source and a drain of the second transistor is electrically connected to the first wiring,
wherein the other of the source and the drain of the second transistor is electrically connected to a second wiring,
wherein the second circuit is connected to the first circuit through the fifth circuit and one of the first wiring and the second wiring,
wherein the third circuit is connected to the first circuit through the other of the first wiring and the second wiring,
wherein the second circuit is configured to supply the one of the first wiring and the second wiring with a gradually changing potential,
wherein the third circuit is configured to supply a predetermined potential to the other of the first wiring and the second wiring and to read second data stored in the first circuit obtained from a potential of the other of the first wiring and the second wiring,
wherein the fourth circuit is configured to compare first data to be written to the first circuit with the second data, and determine whether the first data is consistent with the second data,
wherein the fifth circuit is configured to control conduction between the fourth circuit and the first circuit, and
wherein the fifth circuit is configured to disconnect the second circuit from the first circuit when the fourth circuit determines that the first data is consistent with the second data.

10. The semiconductor device according to claim 9, wherein a potential of the one of the first wiring and the second wiring at a time when the fifth circuit is disconnects the second circuit from the first circuit is supplied to the gate of the second transistor.

11. The semiconductor device according to claim 9, wherein the gradually changing potential is a potential that decreases from a high power supply potential to a low power supply potential.

12. The semiconductor device according to claim 9, wherein the gradually changing potential is a potential that increases from a low power supply potential to a high power supply potential.

13. The semiconductor device according to claim 9, wherein the gradually changing potential is supplied to the one of the first wiring and the second wiring after the predetermined potential is supplied to the other of the first wiring and the second wiring.

14. The semiconductor device according to claim 9, wherein the fifth circuit comprises a third transistor, and wherein the third transistor comprises an oxide semiconductor in a channel formation region.

15. The semiconductor device according to claim 9, wherein the first circuit is a memory cell.

16. An electronic device comprising:
the semiconductor device according to claim 9, and
a display device, a speaker, or a microphone.

* * * * *